US012792075B2

(12) United States Patent
Bourguine et al.

(10) Patent No.: US 12,792,075 B2
(45) Date of Patent: Nov. 10, 2026

(54) VOLTAGE REGULATOR CIRCUIT

(71) Applicant: STMicroelectronics (Rousset) SAS, Rousset (FR)

(72) Inventors: Loic Bourguine, Chateauneuf le Rouge (FR); Lionel Esteve, Coudoux (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 448 days.

(21) Appl. No.: 18/485,201

(22) Filed: Oct. 11, 2023

(65) Prior Publication Data

US 2024/0136351 A1 Apr. 25, 2024

(30) Foreign Application Priority Data

Oct. 17, 2022 (FR) ...................................... 2210664

(51) Int. Cl.

| | |
|---|---|
| ***G05F 3/18*** | (2006.01) |
| ***G05F 3/30*** | (2006.01) |
| ***H10D 30/47*** | (2025.01) |
| ***H10D 62/85*** | (2025.01) |
| ***H10D 84/01*** | (2025.01) |

(Continued)

(52) U.S. Cl.

CPC .................. *G05F 3/18* (2013.01); *G05F 3/30* (2013.01); *H10D 30/4732* (2025.01); *H10D 30/4755* (2025.01); *H10D 62/8503* (2025.01); *H10D 84/01* (2025.01); *H10D 84/811* (2025.01); *H10D 84/834* (2025.01)

(58) Field of Classification Search

CPC ......... G05F 3/18–3/30; H10D 30/4732; H10D 30/4755; H10D 62/8503; H10D 84/01; H10D 84/811; H10D 84/834

See application file for complete search history.

(56) References Cited

U.S. PATENT DOCUMENTS

| | | | |
|---|---|---|---|
| 4,952,865 | A | 8/1990 | Pataut et al. |
| 5,444,219 | A | 8/1995 | Kelly |
| 7,773,393 | B2 | 8/2010 | Choi |

(Continued)

FOREIGN PATENT DOCUMENTS

| | | | |
|---|---|---|---|
| CN | 109992035 | A | 7/2019 |
| CN | 111081785 | A | 4/2020 |

(Continued)

OTHER PUBLICATIONS

"Gallium nitride," Wikipedia, retrieved from 1 https://en.wikipedia.org/w/index.php?title=Gallium_nitride&oldid=879521224, Dec. 1, 2022, 1 page.

(Continued)

*Primary Examiner* — Fred E Finch, III

(74) *Attorney, Agent, or Firm* — Seed Intellectual Property Law Group LLP

(57) ABSTRACT

The present disclosure concerns a voltage regulation circuit formed inside and on top of a monolithic semiconductor substrate having a surface covered with a gallium nitride layer, comprising: between a first terminal and a second terminal, a first resistor and a first d-mode type HEMT transistor; and between the first terminal and the third terminal, a second d-mode type HEMT transistor; wherein the midpoint between the first resistor and the first transistor is coupled to the gates of the first and second transistors.

20 Claims, 22 Drawing Sheets

(51) Int. Cl.
*H10D 84/80* (2025.01)
*H10D 84/83* (2025.01)

(56) References Cited

U.S. PATENT DOCUMENTS

| | | | | |
|---|---|---|---|---|
| 8,653,742 | B2 | 2/2014 | Kikuchi et al. | |
| 9,577,530 | B1 | 2/2017 | Ribarich et al. | |
| 9,590,615 | B1 | 3/2017 | Hayakawa et al. | |
| 9,647,476 | B2 | 5/2017 | Kinzer et al. | |
| 9,742,393 | B2 | 8/2017 | Pavao-Moreira et al. | |
| 9,831,867 | B1 | 11/2017 | Kinzer et al. | |
| 9,929,652 | B1 | 3/2018 | Ribarich et al. | |
| 10,008,884 | B2 | 6/2018 | Zhang | |
| 10,097,100 | B1 | 10/2018 | Xue et al. | |
| 10,446,542 | B1 | 10/2019 | Kinzer | |
| 10,996,696 | B2 | 5/2021 | Inoue | |
| 11,121,704 | B2 | 9/2021 | Kaya et al. | |
| 11,558,047 | B2 | 1/2023 | Strijker | |
| 11,770,010 | B2 | 9/2023 | Kinzer et al. | |
| 12,218,589 | B2 | 2/2025 | Hu et al. | |
| 2005/0133855 | A1 | 6/2005 | Graf | |
| 2011/0234255 | A1 | 9/2011 | Chobot | |
| 2013/0265683 | A1 | 10/2013 | Gueltig | |
| 2014/0071714 | A1 | 3/2014 | Li | |
| 2015/0034948 | A1 | 2/2015 | Takahashi | |
| 2016/0049786 | A1 | 2/2016 | Kinzer | |
| 2016/0056721 | A1 | 2/2016 | Kinzer | |
| 2016/0099647 | A1 | 4/2016 | Zhang et al. | |
| 2016/0301408 | A1 | 10/2016 | Roberts et al. | |
| 2016/0372920 | A1 | 12/2016 | Kinzer et al. | |
| 2017/0162483 | A1 | 6/2017 | Kinzer | |
| 2017/0163258 | A1 | 6/2017 | Kinzer et al. | |
| 2017/0194237 | A1 | 7/2017 | Kinzer | |
| 2017/0222644 | A1 | 8/2017 | Kinzer et al. | |
| 2018/0026531 | A1 | 1/2018 | Nagda et al. | |
| 2019/0123740 | A1 | 4/2019 | Chern et al. | |
| 2020/0357907 | A1* | 11/2020 | Udrea | H10D 30/475 |
| 2021/0044286 | A1 | 2/2021 | Kaufmann et al. | |
| 2021/0372859 | A1 | 12/2021 | Chern et al. | |
| 2022/0200590 | A1 | 6/2022 | Ramond | |
| 2022/0208761 | A1 | 6/2022 | Udrea et al. | |
| 2022/0310469 | A1 | 9/2022 | Liao et al. | |
| 2023/0161364 | A1* | 5/2023 | Ghosh | G05F 3/02 327/543 |
| 2023/0178543 | A1* | 6/2023 | Kim | H10D 84/811 |
| 2023/0188128 | A1* | 6/2023 | Sarkar | H03K 17/08122 327/365 |
| 2023/0396158 | A1 | 12/2023 | Huang et al. | |
| 2024/0136350 | A1 | 4/2024 | Bourguine et al. | |
| 2024/0136424 | A1 | 4/2024 | Bourguine | |
| 2024/0136433 | A1 | 4/2024 | Bourguine et al. | |
| 2024/0305203 | A1 | 9/2024 | Esteve et al. | |

FOREIGN PATENT DOCUMENTS

| | | | |
|---|---|---|---|
| CN | 212210843 | U | 12/2020 |
| CN | 113359933 | A | 9/2021 |
| CN | 114756078 | A | 7/2022 |
| CN | 115021735 | A | 9/2022 |
| EP | 0702455 | A2 | 3/1996 |
| FR | 2641127 | A1 | 6/1990 |

OTHER PUBLICATIONS

Boutros et al., "GaN Power Electronics for Automotive Applications," IEEE Energytech, May 29, 2012, pp. 1-4.

* cited by examiner

VOLTAGE REGULATOR CIRCUIT

CROSS-REFERENCE TO RELATED APPLICATION(S)

This application claims the priority benefit of French patent application number FR2210664, filed on Oct. 17, 2022, entitled "Circuit régulateur de tension," which is hereby incorporated by reference to the maximum extent allowable by law.

BACKGROUND

Technical Field

The present disclosure generally relates electronic systems and devices, and more particularly electronic systems and devices formed from a gallium nitride structure (GaN).

Description of the Related Art

It is conventional to form electronic systems and devices from a silicon substrate, but other semiconductor materials may be used. In particular, structures comprising gallium nitride (GaN) may be used.

It would be desirable to be able to at least partly improve certain aspects of electronic systems and devices formed inside and on top of structures comprising gallium nitride.

BRIEF SUMMARY

There is a need for electronic systems and devices formed inside and on top of structures comprising gallium nitride.

There is a need for electronic systems and devices comprising transistors formed inside and on top of structures comprising gallium nitride.

An embodiment overcomes all or part of the disadvantages of known electronic systems and devices.

According to a first aspect, one embodiment provides an electronic device formed inside and on top of a monolithic semiconductor substrate having a surface covered with a gallium nitride layer, comprising at least one e-mode type HEMT power transistor adapted to receiving a maximum voltage of 650 V between its drain and its source, and an analog circuit for controlling said power transistor.

According to an embodiment, the analog control circuit comprises a driver of said power transistor.

According to an embodiment, the analog control circuit comprises at least one logic circuit.

According to an embodiment, the analog control circuit comprises at least one voltage regulation circuit.

According to an embodiment, the analog control circuit comprises at least one high voltage regulation circuit adapted to receiving a maximum voltage of 400 V.

According to an embodiment, the analog control circuit comprises an overtemperature protection circuit.

According to an embodiment, the analog control circuit comprise an overcurrent protection circuit.

According to an embodiment, the device comprises further input and output connection pads.

According to an embodiment, at least two metallization levels are formed on said gallium nitride layer.

According to an embodiment, at least three metallization levels are formed on said gallium nitride layer.

Another embodiment provides an integrated circuit comprising a device describes previously.

According to an embodiment, the circuit is a power converter.

According to an embodiment, the circuit is a switched-mode power supply.

According to a second aspect, one embodiment provides an overtemperature protection circuit formed inside and on top of a monolithic semiconductor substrate having a surface covered with a gallium nitride layer, comprising:

- a first resistor having a first positive temperature coefficient and being arranged in said gallium nitride layer; and
- a second resistor having a second temperature coefficient different from the first coefficient.

According to an embodiment, the second resistor is arranged in said substrate, and wherein said second coefficient is equal to zero.

According to an embodiment, the second resistor is arranged in said gallium nitride layer.

According to an embodiment, said second coefficient is positive.

According to an embodiment, said second coefficient is negative.

According to an embodiment, said second resistor is a silicon and chromium alloy.

According to an embodiment, the circuit comprises further a comparator circuit adapted to comparing a first voltage taken across the first resistor with a second reference voltage.

According to an embodiment, the reference voltage is adapted to being delivered by a voltage dividing bridge.

According to an embodiment, the impedance of the first resistor is adapted to being trimmed.

According to an embodiment, first resistor is formed by a circuit comprising at least one metal fuse.

Another embodiment provides an electronic device formed inside and on top of a monolithic semiconductor substrate having a surface covered with a gallium nitride layer, comprising an overtemperature protection circuit described previously.

According to an embodiment, the device comprises further at least one e-mode type HEMT power transistor adapted to receiving a maximum voltage of 650 V between its drain and its source.

According to an embodiment, said power transistor is formed by at least two assemblies of e-mode type HEMT transistors, and the first resistor is formed between two of said assemblies.

According to a third aspect, one embodiment provides a driver of a first e-mode type HEMT power transistor adapted to receiving a maximum voltage of 650 V between its drain and its source, said circuit being formed inside and on top of a monolithic semiconductor substrate having a surface covered with a gallium nitride layer, and comprising at least a second e-mode type transistor adapted to directly transmitting a control voltage to the gate of the first transistor and having an area greater than 5 $mm^2$.

According to an embodiment, said second transistor has an area in the range from 10 to 15 mm2.

According to an embodiment, said second transistor is formed of an assembly of a plurality of e-mode type transistors.

Another embodiment provides a device comprising said first power transistor and a driver described previously.

According to an embodiment, the second transistor of the driver comprises a drain region in direct contact with a gate region of the first power transistor.

According to a fourth aspect, one embodiment provides a voltage regulation circuit formed inside and on top of a monolithic semiconductor substrate having a surface covered with a gallium nitride layer, comprising:

between a first terminal and a second terminal, a first resistor and a first d-mode type HEMT transistor; and between the first terminal and the third terminal, a second d-mode type HEMT transistor;

wherein the midpoint between the first resistor and the first transistor is coupled to the gates of the first and second transistors.

According to an embodiment, the circuit comprises further between the second terminal and a reference terminal, a zener diode.

According to an embodiment, the zener diode is formed on a portion of the semiconductor substrate which is not covered with the gallium nitride layer.

According to an embodiment, the second terminal or the third terminal are adapted to delivering a power supply voltage.

According to an embodiment, the circuit comprises further, between the first resistor and the first transistor, a third d-mode type HEMT transistor having its gate coupled to the middle node between the first resistor and the third transistor.

According to an embodiment, the circuit comprises further, between the first terminal and a first node adapted to delivering a power supply voltage, a fifth d-mode type HEMT transistor having its gate coupled to the gate of the third transistor.

According to an embodiment, the circuit comprises further, between the first terminal and a second node adapted to delivering a power supply voltage, a sixth d-mode type HEMT transistor having its gate coupled to the gate of the first transistor.

According to an embodiment, the circuit comprises further, between the first terminal and the second terminal a seventh HEMT transistor and a second resistor, the drain of the seventh transistor being coupled to the first terminal, the source of the seventh transistor being coupled to a first terminal of said second resistor, and a second terminal of said second resistor being coupled to the second terminal.

According to an embodiment, wherein the seventh transistor is of d-mode type and has its gate coupled to its drain.

According to an embodiment, the seventh transistor is of e-mode type and is adapted to receiving on its gate a bias voltage.

Another embodiment provides a high voltage regulation circuit comprising the voltage regulator circuit described previously.

According to an embodiment, the circuit comprises further, the voltage regulator circuit described previously.

According to an embodiment, the circuit comprises:

between a fourth terminal and said first terminal, a first diode having its anode coupled to the fourth terminal and its cathode coupled to the first terminal (VCC);

between a fifth terminal and the first terminal, an eight d-mode type HEMT transistor and a second diode;

between a fifth terminal and a sixth terminal, a third resistor and a flip-flop.

the gate of the eighth transistor being coupled to the midpoint between said third resistor and said flip-flop.

According to an embodiment, said eighth transistor is adapted to being controlled by a control circuit comprising:

a ninth e-mode type HEMT transistor having its drain coupled to the gate of the eighth transistor and its source coupled to the sixth terminal;

a comparator circuit adapted to delivering a control voltage to the gate of said ninth transistor and adapted to comparing the voltage of the first terminal with a reference voltage;

a circuit adapted to delivering said reference voltage.

BRIEF DESCRIPTION OF THE SEVERAL VIEWS OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front," "back," "top," "bottom," "left," "right," etc., or to relative positional qualifiers, such as the terms "above," "below," "upper," "lower," etc., or to qualifiers of orientation, such as "horizontal," "vertical," etc., reference is made to the orientation shown in the figures.

Unless specified otherwise, the expressions "around", "approximately," "substantially" and "in the order of" signify within 10%, and preferably within 5%.

Figure 1:
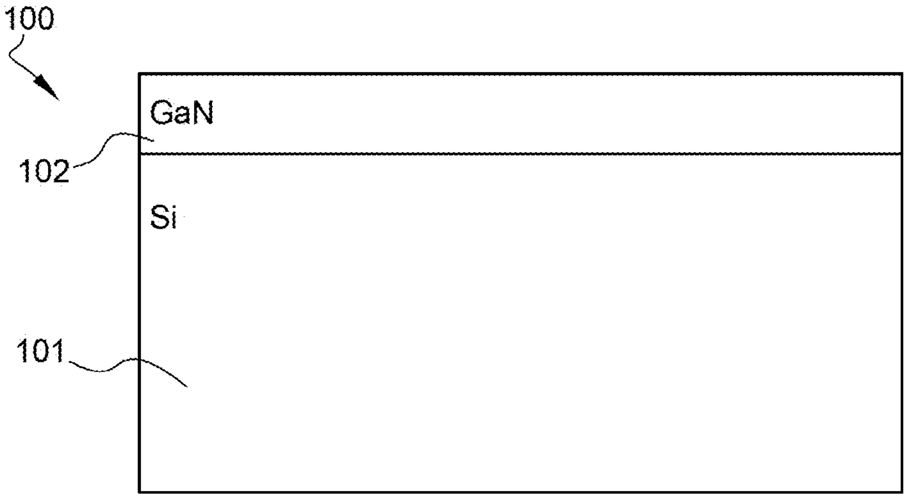
FIG. 1 schematically shows a structure comprising gallium nitride.

FIG. 1 is a cross-section view very schematically showing a semiconductor structure 100 comprising gallium nitride.

Structure 100 is generally formed of a substrate 101 (Si) made of a semiconductor material, for example, a silicon substrate, covered on one of its surfaces with a layer 102 (GaN) made of gallium nitride (GaN). Layer 102 has a thickness in the range from 0.5 to 5 μm.

When structure 100 is used as a base for an electronic system or device, electronic components are formed inside and on top of layer 102. Metallization levels may further be formed on layer 102. Examples of metallization levels are described in relation with FIGS. 29 to 31.

Figure 2A:
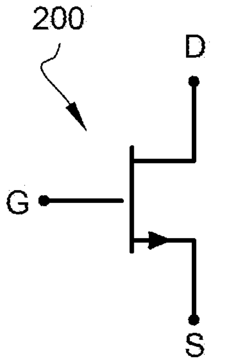
FIGS. 2(A) and 2(B) are a first type of transistor formed inside and on top of a structure comprising gallium nitride.
Figure 2B:
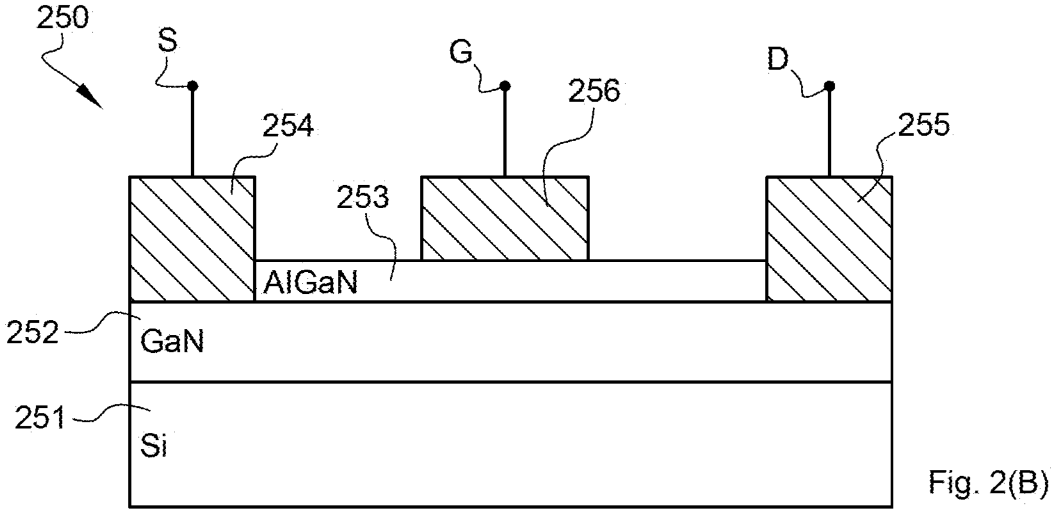

FIGS. 2(A) and 2(B) illustrate a first type of transistor 200 formed in a structure comprising gallium nitride. FIG. 2(A) shows an electric diagram of transistor 200, and FIG. 2(B) shows a cross-section view of a structure 250 forming transistor 200.

Transistor 200 is a high electron mobility transistor (HEMT), also called modulated-doping field effect transistor (MODFET). Hereafter, a high electron mobility transistor is called HEMT transistor.

An HEMT transistor, such as transistor 200 comprises a gate terminal, noted G in FIGS. 2(A) and 2(B), a source terminal, noted S, and a drain terminal, noted D.

Further, transistor 200 is a depletion mode HEMT transistor, called d-mode HEMT transistor or d-mode transistor hereafter. According to another denomination, transistor 200 is an HEMT transistor of normally-ON type or normally-ON HEMT transistor, or normally-ON transistor. The electric diagram of transistor 200 disclosed in FIG. 2(A) is the electric diagram which will be used in all the following drawings to represent a d-mode or normally-ON transistor.

In practice, transistor 200 can be obtained by a structure 250 formed from a structure of the type of the structure 100 described in relation with FIG. 1. Thus, structure 250 comprises a substrate 251 (Si) made of a conductive material, such as silicon, having a surface covered with a gallium nitride layer 252 (GaN). Gallium nitride layer 252 is partially covered with a layer 253 (AlGaN) made of aluminum gallium nitride. A connection terminal 254 forms the source contacting area S of transistor 200. Connection terminal 254 is formed on a portion of layer 252 which is not covered with layer 253. A connection terminal 255 forms the drain contacting area D of transistor 200. Connection terminal 255 is formed on a portion of layer 252 which is not covered with layer 253. A connection terminal 256 forms the gate contacting area G of transistor 200. Connection terminal 256 is formed on a portion of layer 253, and is arranged between connection pads 254 and 255.

Transistor 200 operates as follows. When the gate G of transistor 200 is left floating or a positive voltage is applied between its gate G and its source S, transistor 200 is on or conductive, whereby its being called normally-ON. To "turn off" transistor 200, that is, make it non-conductive, a negative voltage has to be applied between its gate G and its source S.

The connection pads 254, 255 is formed in contact with a top surface of the GaN layer 252. A bottom surface of the connection pads 254, 255 is closer to the silicon substrate 251 than a bottom surface of the connection terminal 256 is to the substrate.

Figure 3A:
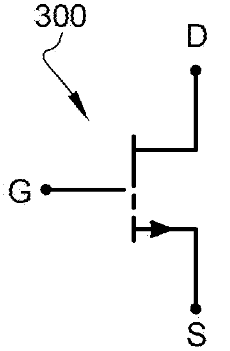
FIGS. 3(A) and 3(B) are a second type of transistor formed in a structure comprising gallium nitride.
Figure 3B:
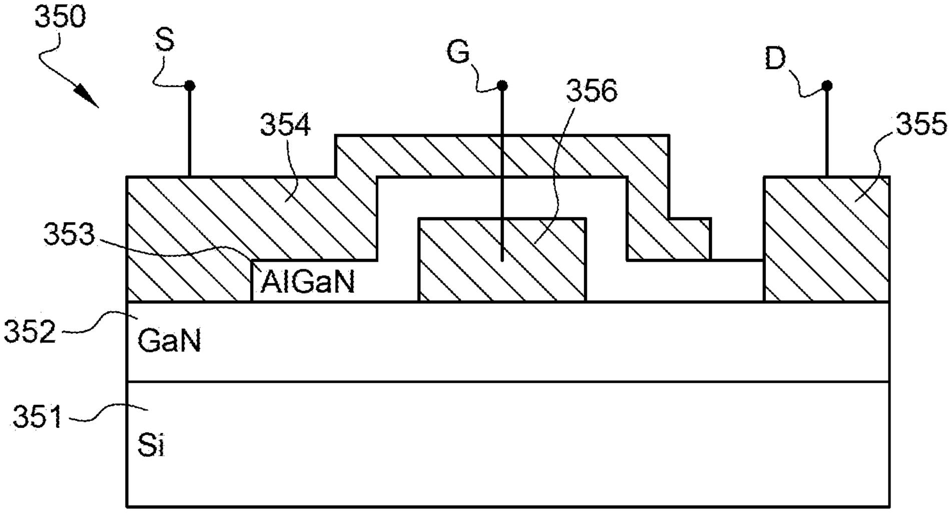

FIGS. 3(A) and 3(B) illustrate a second type of transistor 300 formed in a structure comprising gallium nitride. FIG. 3(A) shows an electric diagram of transistor 300, and FIG. 3(B) shows a cross-section view of a structure 350 forming transistor 300.

Like the transistor 200 described in relation with FIGS. 2(A) and 2(B), transistor 300 is a high electron mobility transistor or HEMT transistor. Transistor 300 comprises a gate terminal, noted G in FIGS. 3(A) and 3(B), a source terminal, noted S in FIGS. 3(A) and 3(B), and a drain terminal, noted D in FIGS. 3(A) and 3(B).

Further, and conversely to the transistor 200 of FIGS. 3(A) and 3(B), transistor 300 is an enhancement mode HEMT transistor, called hereafter e-mode HEMT transistor or e-mode transistor. According to another denomination, transistor 300 is an HEMT transistor of normally-OFF type or normally-OFF HEMT transistor, or normally-OFF transistor. The electric diagram of the transistor 300 disclosed in FIG. 3(A) is the electric diagram which will be used in all the following drawings to represent an e-mode or normally-OFF transistor.

In practice, transistor 300 can be obtained by a structure 350 formed from a structure of the type of the structure 100 described in relation with FIG. 1. Thus, structure 350 comprises a substrate 351 (Si) made of a conductive material, such as silicon, having a surface covered with a gallium nitride layer 352 (GaN). Gallium nitride layer 352 is partially covered with a layer 353 (AlGaN) made of aluminum gallium nitride. A connection terminal 354 forms the source contacting area S of transistor 300. Connection terminal 354 is formed on a portion of layer 352 which is not covered with layer 353. A connection terminal 355 forms the drain contacting area D of transistor 300. Connection terminal 355 is formed on a portion of layer 352 which is not covered with layer 353. A connection terminal 356 forms the gate contacting area G of transistor 300. Connection terminal 356 is formed between layer 352 and layer 353 and is arranged between connection pads 354 and 355. Further, a portion of connection pad 354 covers the portion of layer 353 covering connection pad 356 as shown in FIG. 3(B).

Transistor 300 operates as follows. When gate G of transistor 300 is left floating or a negative voltage is applied between its gate G and its source S, transistor 300 is not conducting or off, whereby its being called normally-OFF transistor. To "turn on" transistor 300, that is, make it conductive, a positive voltage has to be applied between its gate G and its source S.

The transistor structure 350 includes the connection pad 356 which is formed on a top surface of the GaN layer 352. The layer 353 overlaps and covers at least a portion of the connection pad 356. The connection pad 354 is in contact with the top surface of the GaN layer on a first side of the connection pad 356. The connection pad 354 extends from the top surface on the first side of the connection pad 356 over the layer 353, over the connection pad 356, and on to a portion of the layer 353 on a second side of the connection pad 356. The first and second side of the connection pad 356 are spaced from each other along a first direction, left to right in FIG. 3(B). The connection terminal 355 is in contact with the top surface of the GaN layer on the second side of the connection pad 356. There is a space between the connection pad 354 and the connection terminal 355 on the portion of the layer 353.

Figure 4:
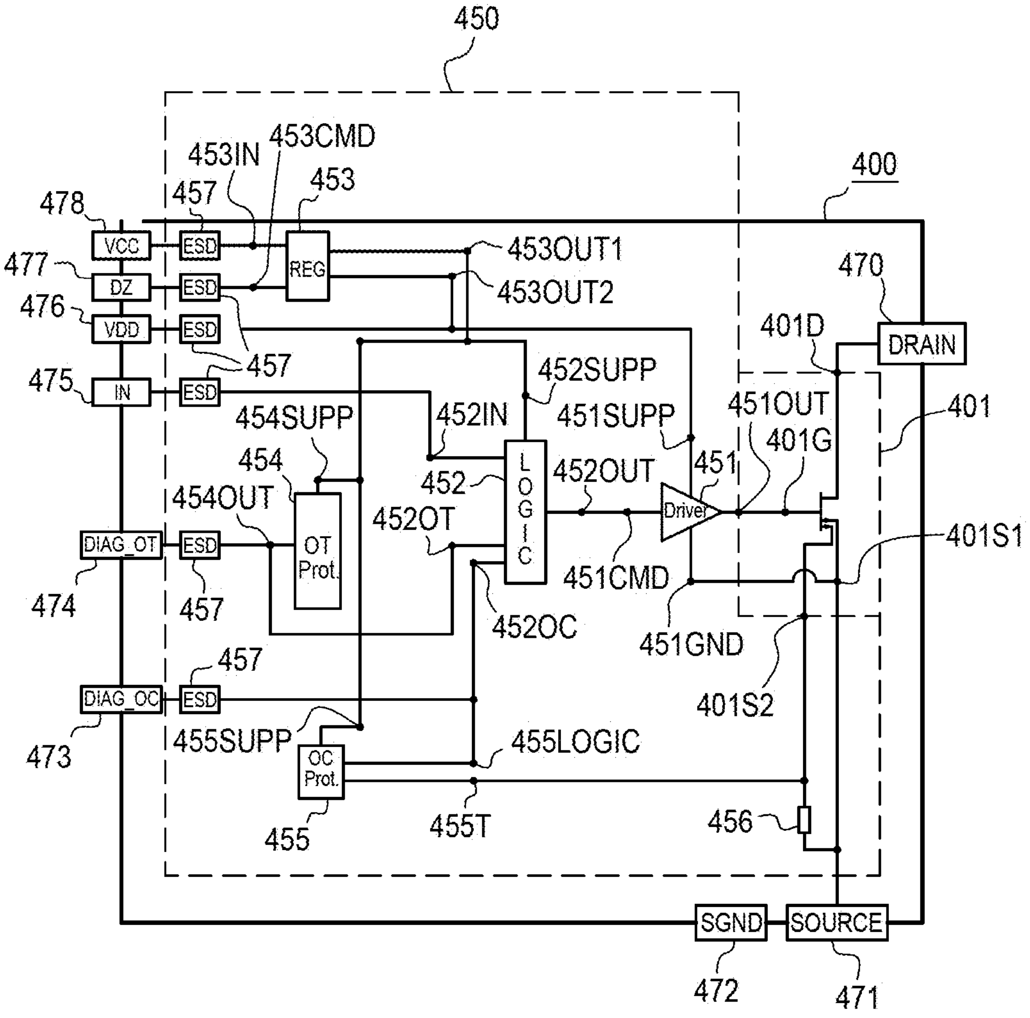
FIG. 4 schematically shows in the form of blocks an embodiment of an electronic device formed inside and on top of a structure comprising gallium nitride.

FIG. 4 schematically shows in the form of blocks an embodiment of an electronic device 400 formed inside and on top of a structure of the type of the structure described in relation with FIG. 1.

According to an embodiment, device 400 is entirely formed inside and on top of a structure of the type of the structure 100 described in relation with FIG. 1, that is, a structure comprising gallium nitride (GaN), and more particularly, a structure formed of a semiconductor substrate having a surface covered with a gallium nitride layer. In other words, device 400 is formed entirely inside and on top of a monolithic structure of the type of the structure 100 described in relation with FIG. 1.

According to an embodiment, device 400 is an electronic device adapted to withstanding high voltages, that is, voltages ranging up to 650 V. For this purpose, device 400 comprises a power transistor 401 and an analog circuit 450 for controlling power transistor 401.

Power transistor 401 is an emission mode HEMT transistor, or e-mode transistor, or normally-OFF transistor comprising a drain terminal 401D, two source terminals 401S1 and 401S2, and a gate terminal 401G. Source terminal 401S1 is in practice arranged between source terminal 401S2 and the gate terminal 401G of transistor 401. Power transistor 401 is sized to withstand a maximum voltage in the order of 650 V between its drain terminal 401D and its source terminal 401S1 or 401S2.

In practice, power transistor 401 is an assembly of a plurality of e-mode transistors in parallel. An example of assembly capable of forming transistor 401 is described in relation with FIG. 5.

Analog control circuit 450 is adapted to controlling power transistor 401. Circuit 450 comprises:

- a driver 451 (DRIVER) of transistor 401;
- logic circuits 452 (LOGIC);
- voltage regulator circuits 453 (REG);
- an overtemperature protection circuit 454 (OT Prot);
- an overcurrent protection circuit 455 (OC Prot);
- a resistor 456; and
- one or a plurality of electrostatic discharge protection circuits 457 (ESD).

Device 400 further comprises input and output connection terminals, or input and output connection pads, shown in FIG. 4 by blocks arranged on the line delimiting the block forming device 400. The input and output connection terminals comprise:

- a drain terminal 470 (DRAIN) of power transistor 401 coupled, preferably connected, to terminal 401D;
- a source terminal 471 (SOURCE) of power transistor 401 coupled, preferably connected, to terminal 401S2;
- a reference terminal 472 (SGND);
- an overcurrent diagnosis terminal 473 (DIAG_OC);
- an overtemperature diagnosis terminal 474 (DIAG_OT);
- a command input terminal 475 (IN);
- a power supply terminal 476 (VDD) delivering a power supply voltage of driver 451;
- a power supply voltage control and delivery terminal 477 (DZ); and
- a power supply terminal 478 (VCC) delivering a power supply voltage of device 400.

Figure 29:
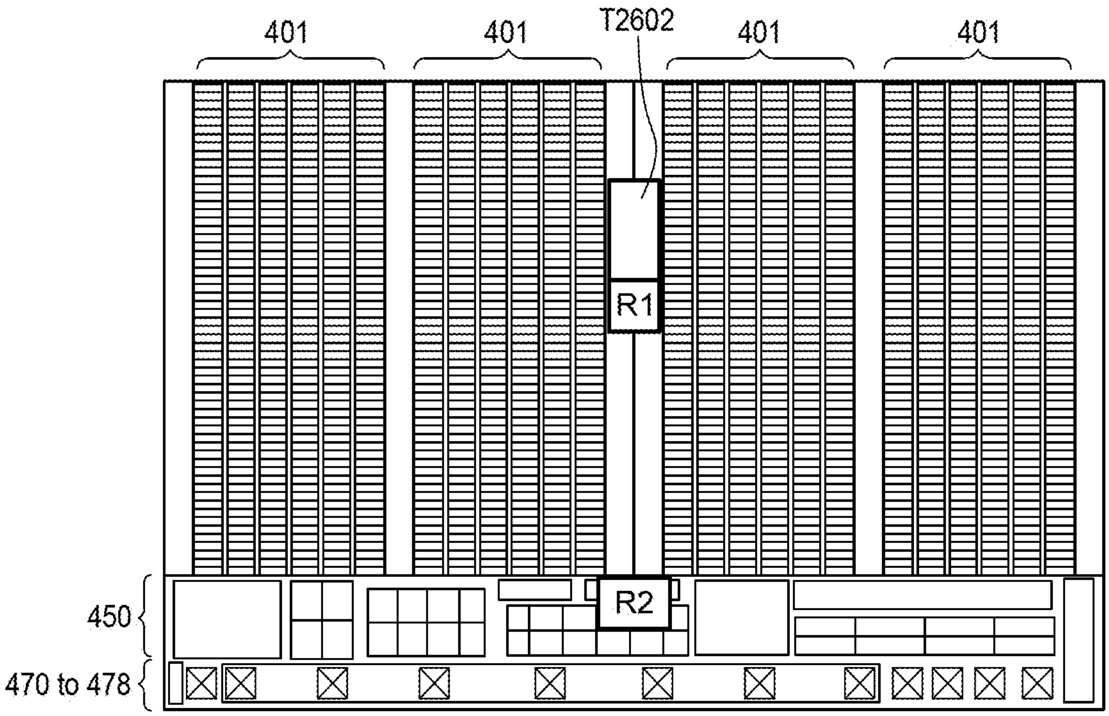
FIG. 29 shows a detailed top view of the embodiment of FIG. 4 illustrating the positioning of the driver of FIG. 27.
Figure 30:
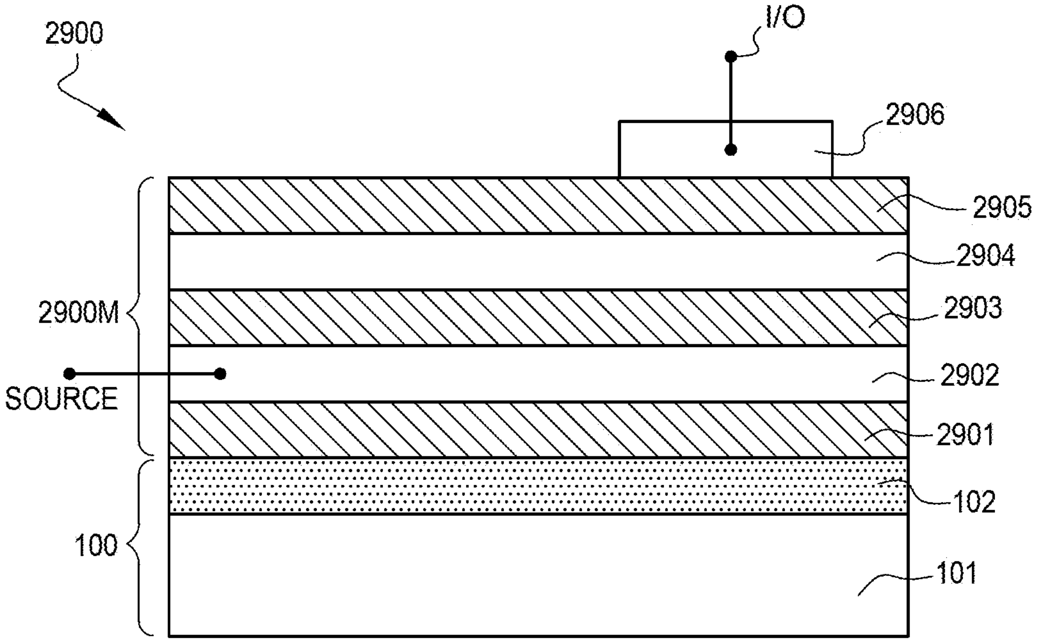
FIG. 30 schematically shows a cross-section view of a first embodiment of a connection terminal of the device of FIG. 4.
Figure 31:
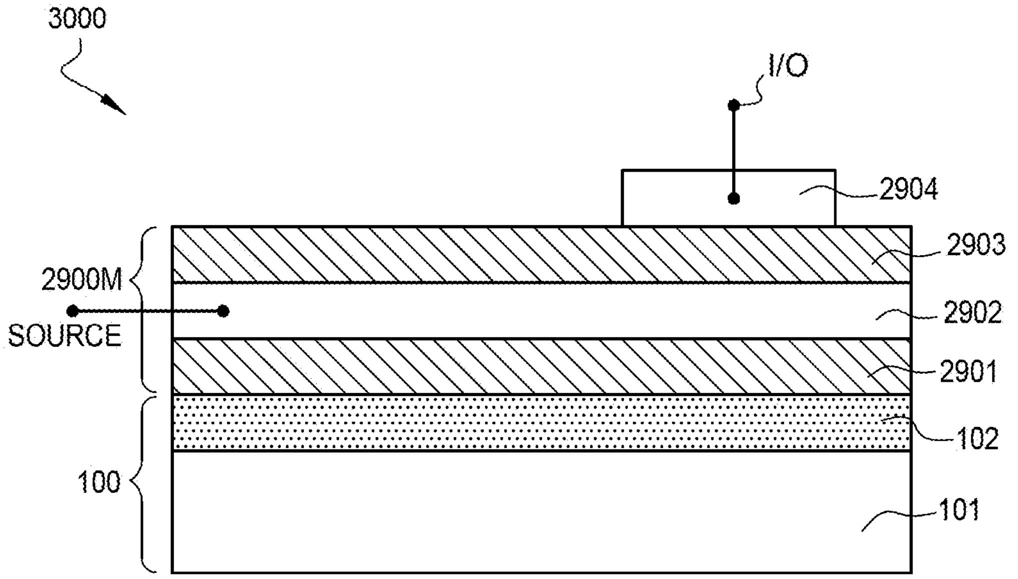
FIG. 31 schematically shows a cross-section view of a second embodiment of a connection terminal of the device of FIG. 4.

Practical embodiments of connection terminals are described in relation with FIGS. 29 to 31.

The driver 451 (DRIVER) of transistor 401 comprises a power supply terminal 451SUPP, a reference power supply terminal 451GND, a control terminal 451CMD, or input terminal 451CMD, and an output terminal 451OUT. Reference terminal 451GND is coupled, preferably connected, to the source terminal 401S1 of power transistor 401 and to the source terminal 471 of device 400. Output terminal 451OUT is coupled, preferably connected, to the gate terminal 401G of power transistor 401. Detailed examples of drivers 451 are described in relation with FIGS. 22 to 24.

Logic circuits 452 (LOGIC) enable to manage all the control logic of driver 451, these circuits being within the abilities of those skilled in the art. According to an example, the logic circuits implement a "NAND"-type logic gate. Logic circuits 452 comprise:

a power supply terminal 452SUPP;

an input terminal 452IN;

an output terminal 452OUT coupled, preferably connected, to the control terminal 451CMD of driver 451;

an overtemperature diagnosis terminal 452OT; and an overcurrent diagnosis terminal 452OC.

Logic circuits 452 may form part of driver 451.

Voltage regulator circuits 453 (REG) are circuits delivering, from a power supply voltage originating from terminal 478, a power supply voltage adapted to powering driver circuit 451, logic circuits 452 and diagnosis circuits 454 and 455. The circuits comprise an input terminal 453, a control terminal 453CMD, and at least two output power supply terminals 453OUT1 and 453OUT2. Input terminal 453IN is coupled, preferably connected, to the power supply terminal 478 of device 400. Control terminal 453CMD is coupled, preferably connected, to the control terminal 477 of device 400. Input terminal 453OUT1 delivers, for example, a power supply voltage to circuits 452, 454, and 455 and is, among others, coupled, preferably connected, to the terminal 452SUPP of logic circuits 452. Input terminal 453OUT2 delivers, for example, a power supply voltage to driver 451 and is coupled, preferably connected, to the terminal 451SUPP of driver 451, and to the power supply terminal 476 of device 400. Detailed examples of voltage regulator circuits 453 are described in relation with FIGS. 7(A) to 17.

Overtemperature protection circuit 454 (OT Prot) enables to detect an abnormal temperature increase for example, an exceeding of a threshold temperature, for example, in the order of 175° C., likely to damage device 400. Circuit 454 comprises a power supply terminal 454SUPP and an output terminal 454OUT. Power supply terminal 454SUPP is coupled, preferably connected, to the output terminal 453OUT1 of circuits 453. Output terminal 454OUT is coupled, preferably connected, to the diagnosis terminal 474 of device 400 and to the diagnosis terminal 452OT of logic circuits 452. Detailed examples of overtemperature protection circuits 454 are described in relation with FIGS. 18 to 21(B).

Overcurrent protection circuit 455 (OC Prot), or current peak protection circuit, enables to detect an abnormal current increase likely to damage device 400. Circuit 455 comprises a power supply terminal 455SUPP, a diagnosis terminal 455LOGIC of the logic circuits, and a diagnosis terminal 455T of power transistor 401. Power supply terminal 455SUPP is coupled, preferably connected, to the output terminal 453OUT1 of circuits 453. Diagnosis terminal 454LOGIC is coupled, preferably connected, to the diagnosis terminal 473 of device 400 and to the diagnosis terminal 452OC of logic circuits 452. Diagnosis terminal 455T is coupled, preferably connected, to the source terminal 401S2 of power transistor 401. Detailed examples of overcurrent protection circuits 454 are described in relation with FIGS. 26 to 28.

Resistor 456 is arranged between the source terminals 401S1 and 401S2 of power transistor 401. More particularly, a first terminal of resistor 456 is coupled, preferably connected, to source terminal 401S1, and a second terminal of resistor 456 is coupled, preferably connected, to source terminal 401S2 and to the diagnosis terminal 455T of circuit 455. Resistor 456 is a shunt resistor allowing to read the tension between the drain and the source of transistor 401 when this one is on or conductive.

The or the plurality of electrostatic discharge protection circuits 457 (ESD) enable to protect all or part of the input and output connection terminals 470 to 478 of device 400. In FIG. 4, terminals 473 to 478 are each protected by a circuit 457. More particularly, six circuits 457 are placed, respectively, between terminals 478 and 453IN, terminals 477 and 453CMD, terminals 476 and 453OUT2, terminals 475 and 452IN, terminals 474 and 454OUT, and terminals 473 and 455LOGIC.

Devices 400 may be used in a plurality of types of electronic systems, for example, integrated circuits, such as switched-mode power supplies, boost converters. A top view of an example of embodiment of device 400 is described in relation with FIG. 6. Detailed examples of application of device 400 are described in relation with FIGS. 32 to 34.

Figure 5:
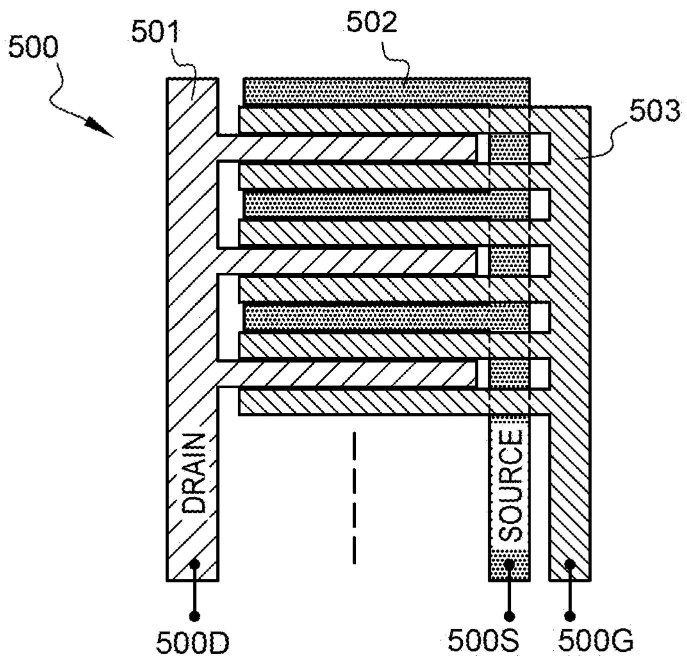
FIG. 5 shows a simplified top view of a portion of the embodiment of FIG. 4.

FIG. 5 is a simplified top view of a or a portion of an assembly 500 enabling to form a power transistor of the type of the transistor 401 described in relation with FIG. 4.

Assembly 500 is formed by a plurality of e-mode or normally-OFF transistors arranged in parallel and having a common drain region 501, a common source region 502, and a common gate region 503. For this purpose, regions 501, 502, and 503 each have a comb shape and are nested in one another as illustrated in FIG. 5.

Drain region 501 is coupled, preferably connected, to a drain node 500D. Source region 502 is coupled, preferably connected, to a source node 500S. Gate region 503 is coupled, preferably connected, to a gate node 500G.

Only a portion of an assembly 500 is shown in FIG. 5. Regions 501 to 503 may each comprise up to 28 "teeth," that is, horizontal portions in FIG. 5. To form the transistor 401 of FIG. 1, a plurality of assemblies 500 may be coupled, or even connected, together.

Figure 6:
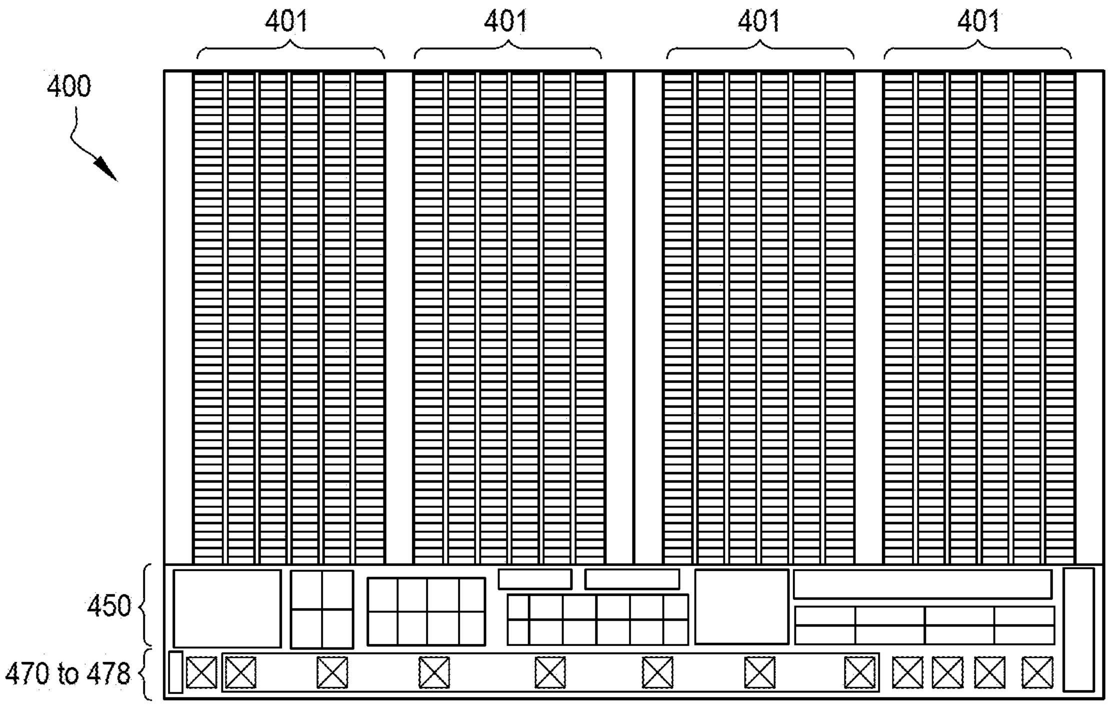
FIG. 6 shows a detailed top view of the embodiment of FIG. 4.

FIG. 6 is a top view of a practical example of embodiment of the device 400 described in relation with FIG. 4. As previously described, device 400 is formed inside and on top of a structure comprising gallium nitride.

In FIG. 6, transistor 401 is formed by at least four assemblies of the type of the assembly 500 described in relation with FIG. 5. The assemblies are vertically separated by regions capable of comprising, certain examples are described in relation with FIGS. 20 and 28, circuits of analog control circuit 450. The rest of analog control circuit 450 is formed against transistor 401. The input/output terminals 470 to 478 (bearing references 470 to 478 in FIG. 6) are formed at the periphery of the structure having device 400 formed inside and on top of it.

FIGS. 7(A) to 17 partially and schematically show in the form of blocks examples of embodiment of circuits that may form part of the voltage regulator circuits 453 described in relation with FIG. 4.

Figure 7A:
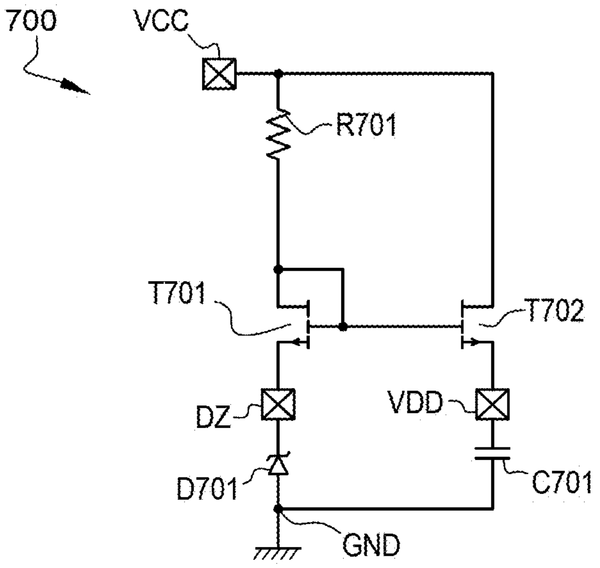
FIGS. 7(A) and 7(B) are an electric diagram of a first embodiment of a voltage regulator circuit of the embodiment of FIG. 4, and a cross-section view of a structure forming the first embodiment of a voltage regulator circuit.
Figure 7B:
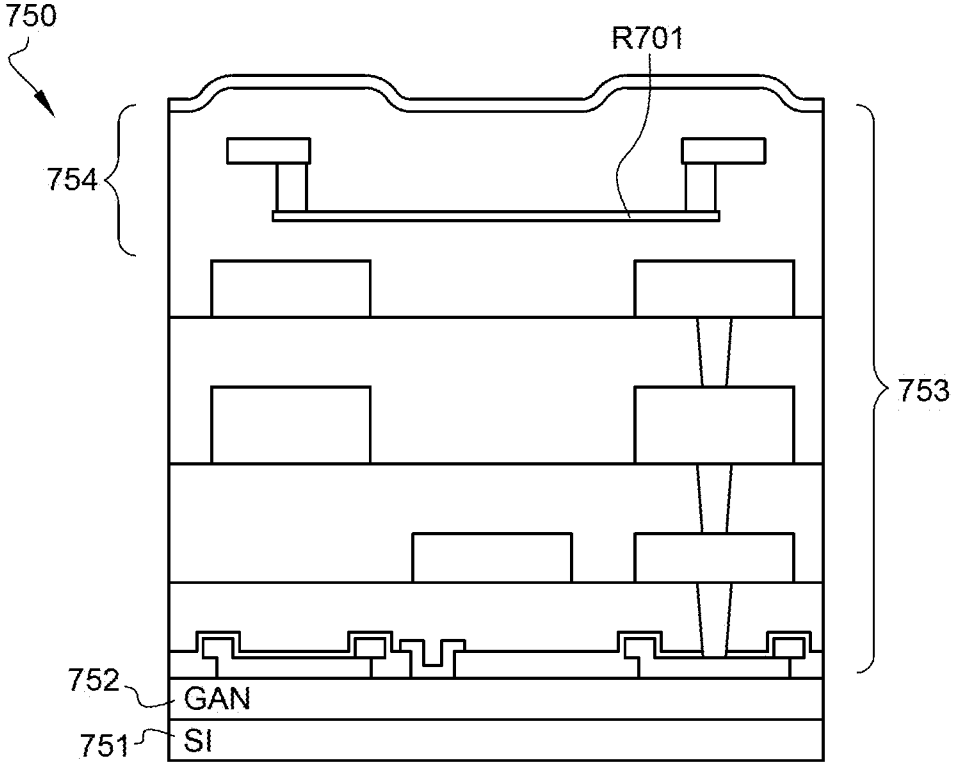

FIG. 7(A) includes a first embodiment of a voltage generation circuit 700, or voltage regulator circuit 700, adapted to forming part of the device 400 described in relation with FIG. 4. FIG. 7(B) is a cross-section view of a structure forming a portion of circuit 700.

Voltage regulator circuit 700 is adapted to being coupled to three connection terminals of device 400, and more particularly:

to a terminal VCC corresponding to the connection terminal 478 of device 400;

to a terminal DZ corresponding to the connection terminal 477 of device 400; and to a terminal VDD corresponding to the connection terminal 476 of device 400.

Circuit 700 comprises between terminal VCC and terminal DZ a resistor R701 and a transistor T701 of e-mode type.

More particularly, a first terminal of resistor R701 is coupled, preferably connected, to terminal VCC, and a second terminal of resistor R701 is coupled, preferably connected, to the drain of transistor T701. The source of transistor T701 is coupled, preferably connected, to terminal DZ. Further, the gate of transistor T701 is coupled, preferably connected, to the drain of transistor T701. Resistor R701 is a biasing resistor, formed in a two dimensions structure (2DEGAN) comprising Gallium Nitride, and having a positive temperature coefficient.

Circuit 700 further comprises a transistor T702 of e-mode type arranged between terminals VCC and VDD. More particularly, the drain of transistor T702 is coupled, preferably connected, to terminal 702, and the source of transistor T702 is coupled, preferably connected, to terminal VDD. Further, the gate of transistor T702 is coupled, preferably connected, to the gate of transistor T701. Transistor T701 allows to compensate the threshold voltage Vth(T702) of transistor T702. Current I(T701) flowing through is given by the following mathematic formula:

$$I(T701) = \frac{V(VCC) - Vth(T701) - V(DZ)}{R701} \quad \text{Math 1}$$

wherein

V(VCC) represents the voltage at terminal VCC;

V(DZ) represents the voltage at terminal DZ;

Vth(T701) is the threshold voltage of transistor T701; and

R701 corresponds to the resistance of resistor R701.

Circuit 700 further comprises a Zener diode D701 between terminal DZ and a reference node GND, for example receiving the ground. The cathode of diode D701 is coupled, preferably connected, to terminal DZ, and its anode is coupled, preferably connected, to node GND. The Zener diode is external to device 400, or is formed on a portion of the structure 100 of FIG. 1 where the substrate is not covered with the gallium nitride layer.

Circuit 700 further optionally comprises a capacitor C701 having a buffer capacitor function. Capacitor C701 is arranged between terminal VDD and reference node GND. A first terminal of capacitor C701 is coupled, preferably connected, to terminal VDD and a second terminal of capacitor C701 is coupled, preferably connected, to node GND. According to an example, capacitor C701 is external to device 400, or is formed in a portion of the structure 100 of FIG. 1 wherein the substrate is not covered by the Gallium Nitride layer.

According to an embodiment, resistor R701 may be directly formed in the gallium nitride layer of the structure of device 400, and may comprise a positive temperature coefficient. According to a variant, resistor R701 may be a resistor made of a silicon chromium alloy (SiCr). On view (B) of FIG. 7, the disposition of resistor R701 is shown. More particularly, in view (B), a cross section view of a structure 750 of type of structure 100 described in relation with FIG. 1 is represented. Structure 750 comprises successively:

a semiconductor substrate 751 (Si), for example is silicon;

a Gallium Nitride layer 752 (GAN); and metallization levels 753.

In the last metallization level 754 of levels 753, meaning the furthest level from the Gallium Nitride layer, structure 750 comprises metallization from which resistor R701 can be formed.

Circuit 700 enables to supply a current at the level of terminal DZ, and to create a voltage across zener diode D701. This voltage is independent from the voltage delivered at the level of terminal VCC and may be used to power one or a plurality of circuits of the control circuit 450 of device 400 via terminal VDD. Moreover, this voltage can be a stable reference voltage allowing to create the supply voltage furnished via terminal VDD.

Figure 8:
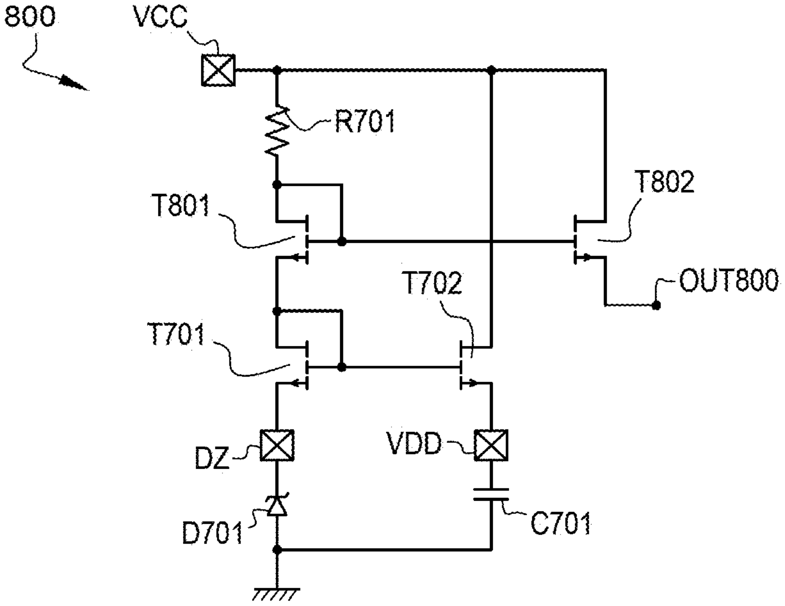
FIG. 8 shows an electric diagram of a second embodiment of a voltage regulator circuit of the embodiment of FIG. 4.

FIG. 8 shows a second embodiment of a voltage regulation circuit 800, or voltage regulator circuit 800, adapted to forming part of the device 400 described in relation with FIG. 4.

Circuit 800 has elements common with the circuit 700 of FIGS. 7(A) and 7(B). These elements will not be described again and only the differences between circuits 700 and 800 will be highlighted.

Circuit 800 comprises the same terminals as circuit 700 and all the components of circuit 700 but further comprises two e-mode type transistors T801 and T802.

Transistor T801 is placed between resistor R701 and transistor T701. The drain of transistor T801 is coupled, preferably connected, to the terminal of resistor R801 which is not coupled to terminal VCC, and the source of transistor T801 is coupled, preferably connected, to the drain of transistor T701. Further, the gate of transistor T801 is coupled, preferably connected, to the drain of transistor T801. Transistor T801 is a voltage follower transistor.

Transistor T802 is placed between terminal VCC and an output node OUT800 of circuit 800. The drain of transistor T802 is coupled, preferably connected, to terminal VCC and the source of transistor T801 is coupled, preferably connected, to node OUT800. Further, the gate of transistor T802 is coupled, preferably connected, to the gate of transistor T801.

Current I(DZ), provided in terminal DZ, is given by the following mathematical formula:

$$I(DZ) = \frac{V(VCC) - Vth(T701) - Vth(T801) - V(DZ)}{R701} \quad \text{Math 2}$$

wherein Vth(T801) is the threshold voltage of transistor T801.

Voltage V(VDD), provided in terminal DZ, is given by the following mathematical formula:

$$V(VDD)=V(DZ)+Vth(T701)+Vth(T702) \quad (3)$$

wherein Vth(T702) is the threshold voltage of transistor T702.

Like circuit 700, circuit 800 delivers on terminal VDD a power supply voltage, but circuit 800 may additionally deliver, at the level of node OUT800, a second power supply voltage independent from the voltage received on node VCC and from the voltage delivered at the level of node VDD. If a second power supply voltage is not necessary, transistor T802 can be omitted. The advantage of providing several independent supply voltages is to allow to isolate a supply, on which noise car appears, from another more sensible one.

Figure 9:
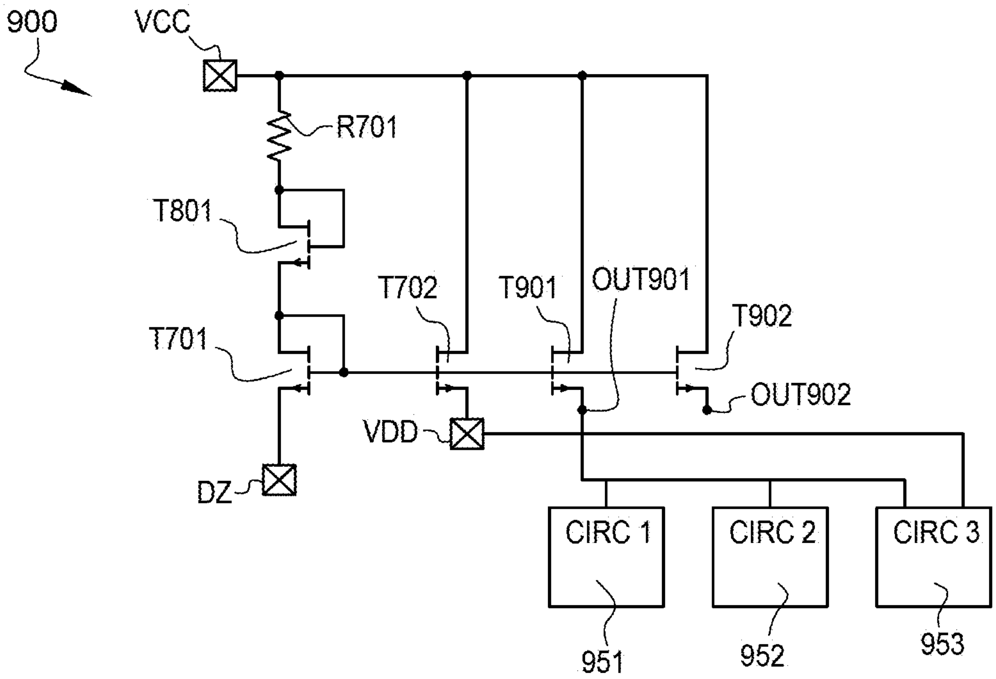
FIG. 9 shows an electric diagram of a third embodiment of a voltage regulator circuit of the embodiment of FIG. 4.

FIG. 9 shows a third embodiment of a voltage regulation circuit 900, or voltage regulator circuit 900, adapted to forming part of the device 400 described in relation with FIG. 4.

Circuit 900 has elements common with the circuit 700 of FIGS. 7(A) and 7(B)/and the circuit 800 of FIG. 8. These elements will not be described again and only the difference between circuits 700, 800, and 900 will be highlighted.

Circuit 900 comprises the same terminals as circuit 700 and all the components of circuit 700, but can comprise, as an option, the transistor T801 of circuit 800. The circuit further comprises at least one transistor T901, and for example, a transistor T902 enabling to deliver a plurality of power supply voltages in parallel.

Transistor T901 is placed between terminal VCC and an output node T901. The drain of transistor T901 is coupled, preferably connected, to terminal VCC and the source of transistor T901 is coupled, preferably connected, to node OUT901. Further, the gate of transistor T901 is coupled, preferably connected, to the gate of transistor T701.

Transistor T902 is placed between terminal VCC and an output node T902. The drain of transistor T902 is coupled, preferably connected, to terminal VCC and the source of transistor T902 is coupled, preferably connected, to node OUT902. Further, the gate of transistor T902 is coupled, preferably connected, to the gate of transistor T701.

Nodes OUT901 and OUT902 and terminal VDD each deliver a power supply voltage. These power supply voltages may be used to power different circuits of the control circuit 450 of device 400. In particular, in FIG. 9, three circuits 951 (CIRC 1), 952 (CIRC 2) and 953 (CIRC 3) likely to form part of circuit 450 are shown and are powered with the power supply voltage delivered by node OUT901. Further, circuit 953 is further powered with the voltage delivered by terminal VDD. According to an example, circuits 951, 952, and 953 can be chosen in the group comprising: protection circuits 472, 474, and 453, logic circuits 452 and the driver circuit 451. As previously said, the advantage of providing several independent supply voltages is to allow isolating a supply wherein noise can appear, from another more sensible one.

According to a variant, circuit 900 may comprise other transistors arranged similarly to transistors T901 and T902 to deliver other power supply voltages on other output nodes of circuit 900.

Figure 10:
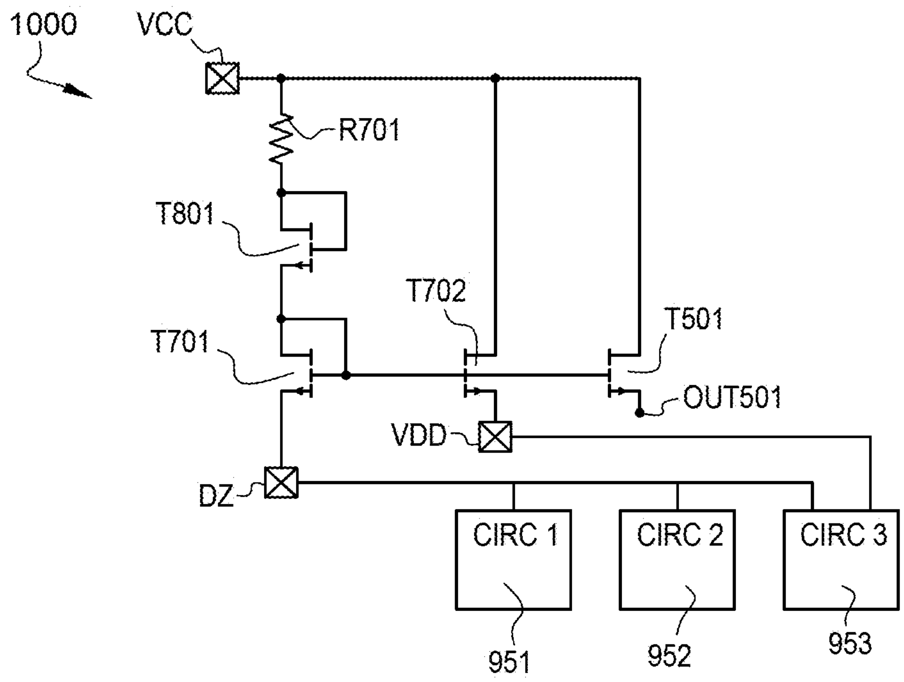
FIG. 10 shows an electric diagram of a fourth embodiment of a voltage regulator circuit of the embodiment of FIG. 4.

FIG. 10 shows a fourth embodiment of a voltage regulation circuit 1000, or voltage regulator circuit 1000, adapted to forming part of the device 400 described in relation with FIG. 4.

Circuit 1000 has elements common with the circuit 700 of FIGS. 7(A) and 7(B), the circuit 800 of FIG. 8, and the circuit 900 of FIG. 9. These elements will not be described again and only the differences between circuits 700, 800, 900, and 1000 will be highlighted.

Circuit 1000 is similar to circuit 900 but comprises no transistor T902 and output node OUT902.

The significant difference between circuit 1000 and circuit 900 is that the voltage at the level of terminal DZ is used to power circuits 951, 952, and 953.

Moreover, an advantage of this embodiment is that the supply provided on terminal DZ is more precise than the one provided by transistors T702, T901 and T902.

Figure 11:
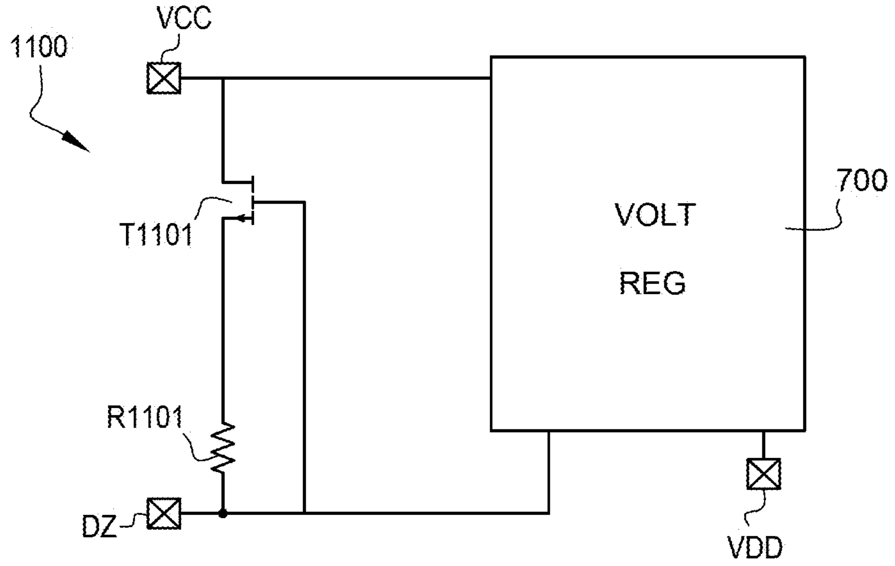
FIG. 11 shows an electric diagram of a fifth embodiment of a voltage regulator circuit of the embodiment of FIG. 4.

FIG. 11 shows a fifth embodiment of a voltage regulation circuit 1100, or voltage regulator circuit 1100, adapted to forming part of the device 400 described in relation with FIG. 4.

Voltage regulation circuit 1100 is adapted to being coupled to three connection terminals of device 400, and more particularly:

- to terminal VCC corresponding to the connection terminal 478 of device 400;
- to terminal DZ corresponding to the connection terminal 477 of device 400; and
- to terminal VDD corresponding to the connection terminal 476 of device 400.

Voltage regulation circuit 1100 comprises a voltage generation circuit, and more particularly, in FIG. 11, the voltage regulation circuit 700 (VOLT GEN) described in relation with FIGS. 7(A) and 7(B). According to a variant, the voltage regulation circuit may be the circuit 800 described in relation with FIG. 8, the circuit 900 described in relation with FIG. 9, or the circuit 1000 described in relation with FIG. 10.

Circuit 1100 further comprises a d-mode transistor T1101 and a resistor R1101. Transistor T1101 and resistor R1101 are arranged between terminals VCC and DZ. More particularly, the drain of transistor T1101 is coupled, preferably connected, to terminal VCC, and the source of transistor T1101 is coupled, preferably connected, to a first terminal of resistor R1101. The gate of transistor T1101 is coupled, preferably connected, to terminal DZ. The second terminal of resistor R1101 is coupled, preferably connected, to terminal DZ.

Resistor R1101 is of the same type as the resistor R701 of the circuit 700 of FIGS. 7(A) and 7(B).

The output current of circuit 100 is delivered at the level of terminal DZ and is proportional to the voltage between the gate of transistor T1101 and resistor R1101. Output current I(DZ) is given by the following mathematical formula:

$$I(DZ) = -\frac{Vth(T1101)}{R1101} \qquad \text{Math 4}$$

wherein:

- Vth(T1101) is the threshold voltage of transistor T1101; and
- R1101 is the resistance of resistor R1101.

Moreover, voltage regulator 1100 described in relation with FIG. 11 differs from voltage regulators 700 to 1000 described in relation with FIGS. 7(A) to 10 by the fact that it allows to provide an output voltage on node VDD, but also an output current on terminal DZ. This output current has the particularity of not being dependent of the variations of voltage and current occurring on terminal VCC, on the contrary of a current furnished by terminal DZ by one of the voltage regulators 700 to 100 that is dependent of voltage VCC.

Figure 12:
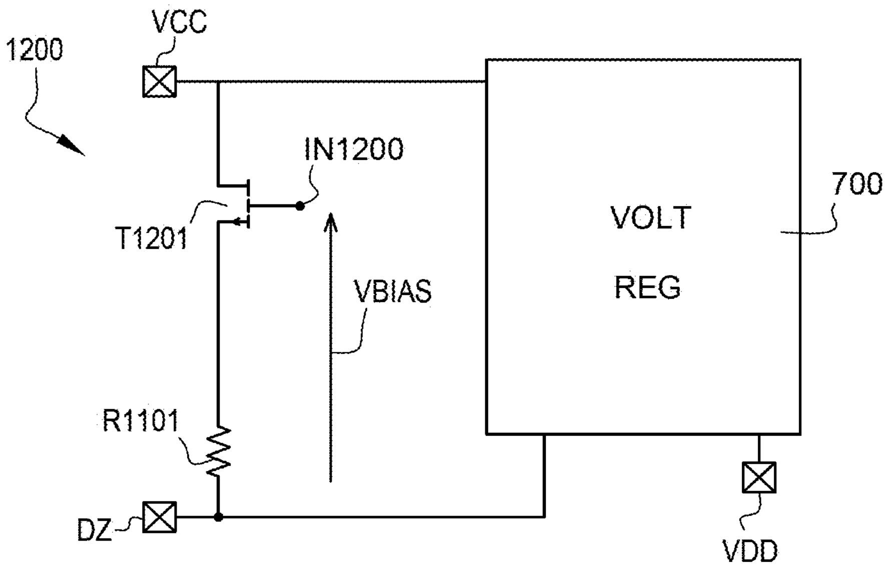
FIG. 12 shows an electric diagram of a sixth embodiment of a voltage regulator circuit of the embodiment of FIG. 4.

FIG. 12 shows a sixth embodiment of a voltage regulation circuit 1200, or voltage regulator circuit 1200, adapted to forming part of the device 400 described in relation with FIG. 4.

Circuit 1200 has elements common with the circuit 1100 of FIG. 11. These elements will not be described again and only the differences between circuits 1100 and 1200 will be highlighted.

Circuit 1200 comprises the same terminals as circuit 1100, resistor R1101, and circuit 700 (VOLT GEN), but comprises, instead of transistor T1101, a transistor T1201.

Transistor T1201 is a transistor of e-mode, or normally-OFF, type. The drain of transistor T1201 is coupled, preferably connected, to terminal VCC, and the source of transistor T1201 is coupled, preferably connected, to a first terminal of resistor R1101. The second terminal of resistor R1101 is coupled, preferably connected, to terminal DZ. The gate of transistor T1201 is coupled, preferably connected, to an input node IN1200 receiving a bias voltage VBIAS enabling to turn on transistor T1201. According to a variant, transistor T1201 is a transistor of d-mode type.

Like circuit 1100, circuit 1200 delivers on node DZ an output current proportional to the resistance of resistor R1101, and independent from the variations of current and voltage occurring on borne VCC.

The advantage of this embodiment is to choose a transistor T1201 scaled for higher voltages, for example for voltage between 10 and 30 V. This allows to apply on terminal VCC a voltage comprised between 10 and 30 V.

Figure 13:
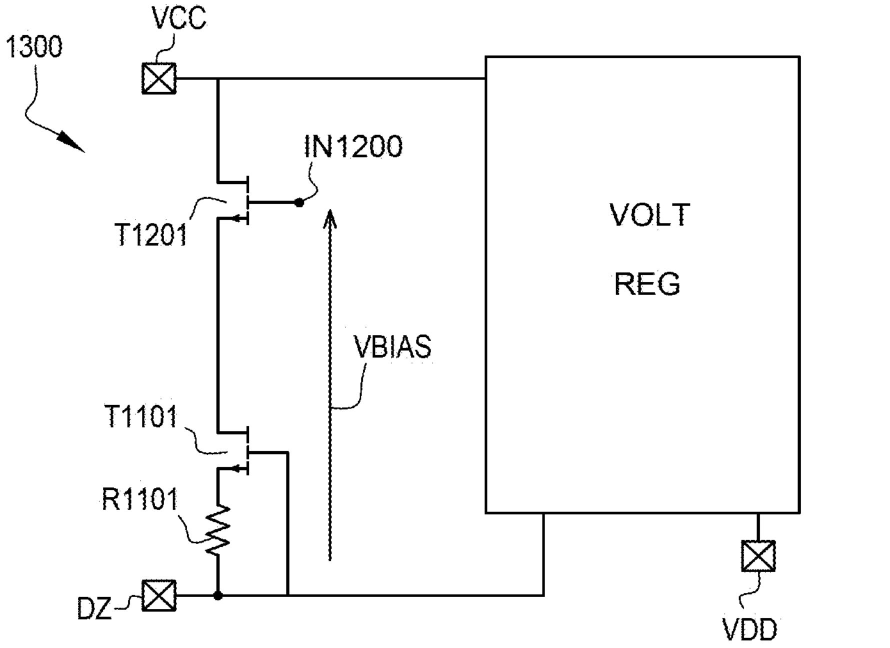
FIG. 13 shows an electric diagram of a seventh embodiment of a voltage regulator circuit of the embodiment of FIG. 4.

FIG. 13 shows a seventh embodiment of a voltage regulation circuit 1300, or voltage regulator circuit 1300, adapted to forming part of the device 400 described in relation with FIG. 4.

Circuit 1300 has elements common with the circuit 1100 of FIG. 11 and with the circuit 1200 of FIG. 11. These elements will not be described again and only the differences between circuits 1100, 1200, and 1300 will be highlighted.

Circuit 1300 is a combination of circuits 1100 and 1200. In practice, circuit 1300 comprises transistors T1101 and T1201 and resistor R1101 and circuit 700.

More particularly, transistor T1201 is positioned on the side of terminal VCC and transistor T1101 is positioned on the side of resistor R1101. According to an example, in this configuration, transistor T1201 has the function of isolating the voltage received by terminal VCC from the drain of transistor T1101.

A preferred embodiment is the circuit 1300 comprising voltage regulation circuit 1000.

Like circuits 1100 and 1200, circuit 1300 has the advantage to provide an output current independent from the variations of current and voltage occurring on terminal VCC.

Figure 14:
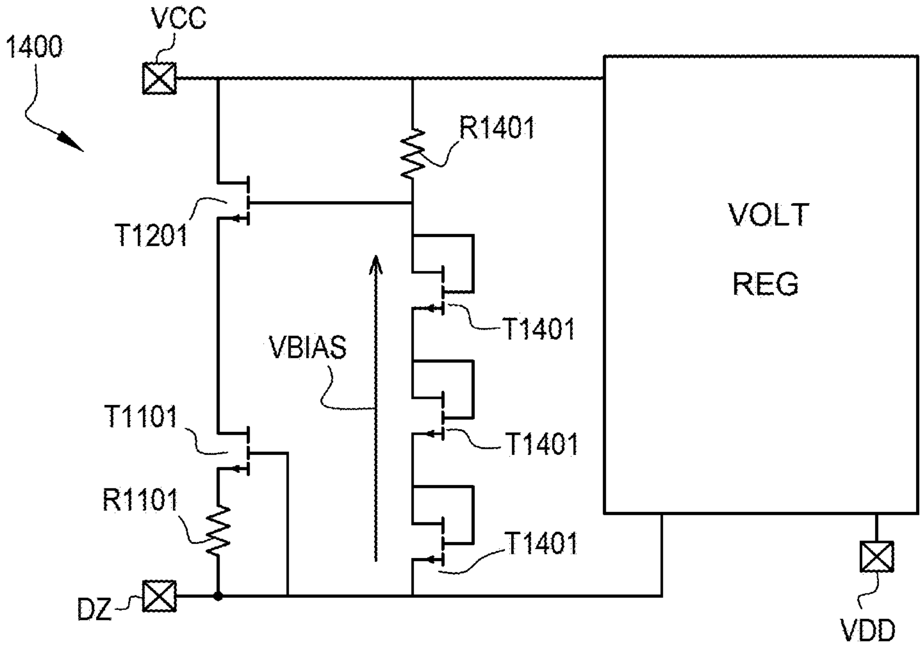
FIG. 14 shows an electric diagram of an eighth embodiment of a voltage regulator circuit of the embodiment of FIG. 4.

FIG. 14 shows an eighth embodiment of a voltage regulation circuit 1400, or voltage regulator circuit 1400, adapted to forming part of the device 400 described in relation with FIG. 4.

Circuit 1400 has elements common with the circuits 1100, 1200 and 1300 of FIGS. 11 to 13. These elements will not be described again and only the differences between circuits 1100, 1200, 1300, and 1400 will be highlighted.

Circuit 1400 comprises all the components of circuit 1300 but further comprises a new branch between terminals VCC and DC enabling to apply voltage VBIAS to the gate of transistor T1201.

This new branch comprises a resistor R1401 and a plurality of transistors T1401 of e-mode type arranged in series. In FIG. 14, circuit 1400 comprises three transistors T1401. A first terminal of resistor R1401 is coupled, preferably connected, to terminal VCC, and the second terminal of resistor R1401 is coupled, preferably connected, to the gate of transistor T1201 and to the drain of a first transistor T1401. The source of first transistor T1401 is coupled, preferably connected, to the drain of the next transistor T1401, and so on. The source of the last transistor T1401 is coupled, preferably connected, to terminal DZ. Further, each transistor T1401 has its gate coupled, preferably connected, to its drain, and is thus "diode"-connected.

Resistor R1401 and transistors T1401 are sized to deliver voltage VBIAS to the gate of transistor T1201. Moreover, resistor R1404 is a biasing resistor, that allows to limit the current flowing through transistor T1401. Voltage VBIAS is given by the following mathematic formula:

Math 5

$$VBIAS=3*Vth(T1401) \quad (5)$$

wherein Vth(T1401) is the threshold of one of transistors T1401.

Current I(R1401) flowing through resistor R1401 is given by the following mathematic formula:

$$VI(R1401)=\frac{V(VCC)-3*Vth(T1401)-V(DZ)}{R1041} \quad \text{[Math 6]}$$

wherein R1401 is the resistance of resistor R1401.

Like circuits 1100, 1200, and 1300, circuit 1400 has the advantage to provide an output current independent from the variations of current and voltage occurring on terminal VCC.

Figure 15:
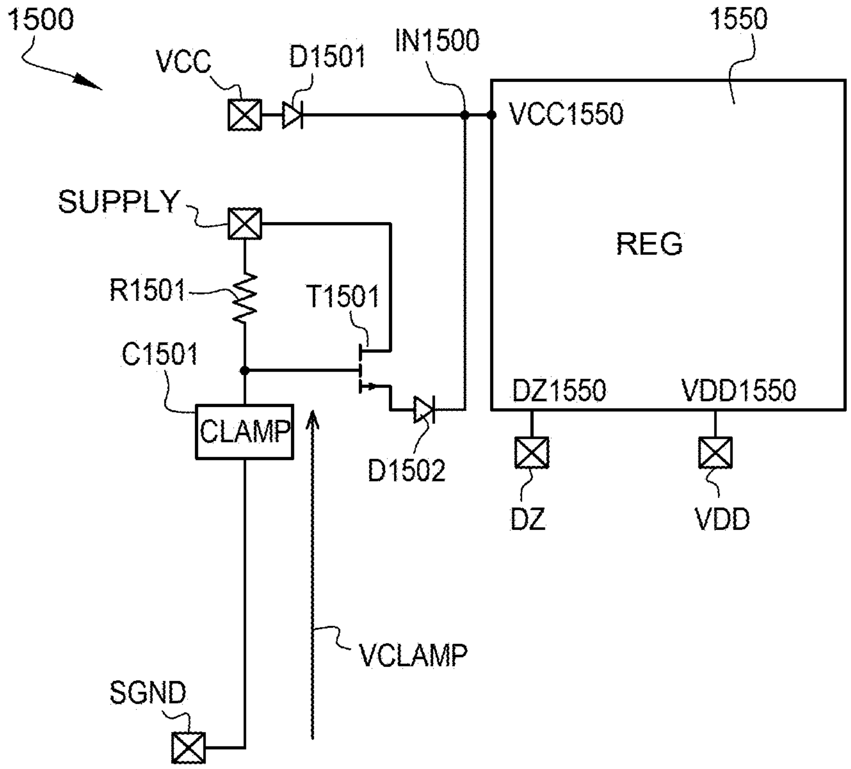
FIG. 15 shows an electric diagram of a first embodiment of a high voltage regulator circuit of the embodiment of FIG. 4.

FIG. 15 shows a first embodiment of a high-voltage regulation circuit 1500, or high-voltage regulator circuit 1500, adapted to forming part of the device 400 described in relation with FIG. 4.

High-voltage regulation circuit 1500 is adapted to being connected to five connection terminals of device 400, and more particularly:

- to terminal VCC corresponding to the connection terminal 478 of device 400;
- to terminal DZ corresponding to the connection terminal 477 of device 400;
- to terminal VDD corresponding to the connection terminal 476 of device 400;
- to an inner terminal SUPPLY of device 400 adapted to receiving a maximum voltage in the order of 400 V; and
- to a terminal SGND corresponding to the reference connection terminal 472 of device 400.

High-voltage regulation circuit 1500 is a circuit adapted to receiving a maximum voltage in the order of 400 V on terminal SUPPLY, and to delivering on terminal VDD a voltage smaller than the voltage furnished to terminal DZ.

Regulation circuit 1500 comprises a circuit 1550 (GEN) that may be a voltage regulation circuit such as one of the circuits described in relation with FIG. 7(A) to 10 or their variants, or that may be a voltage regulation circuit such as one of the circuits described in relation with FIGS. 11 to 14 or their variants. As described in relation with FIGS. 7(A) to 14, circuit 1550 is adapted to being coupled, preferably connected, to three terminals of device 400, in particular terminals VCC, DZ, and VDD. Circuit 1550 then comprises a terminal VCC1550 normally coupled to terminal VCC, a terminal DZ1550 normally coupled to terminal DZ, and a terminal VDD1550 normally coupled to terminal VDD. In circuit 1500, terminal VCC1550 is coupled, preferably connected, to node IN1500, terminal DZ1550 is coupled, preferably connected, to terminal DZ, and terminal VDD1550 is coupled, preferably connected, to terminal VDD.

Circuit 1500 further comprises, between terminal VCC and node IN1500, an HEMT-type diode D1501, or high electron mobility diode. The anode of diode D1501 is coupled, preferably connected, to terminal VCC, and the cathode of diode D1501 is coupled, preferably connected, to node IN1500.

Circuit 1500 further comprises, between terminal SUPPLY and node IN1500, a e-mode type transistor T1501 and a diode D1502. The drain of transistor T1501 is coupled, preferably connected, to terminal SUPPLY, and the source of transistor T1501 is coupled, preferably connected, to the anode of diode D1502. The cathode of diode D1502 is coupled, preferably connected, to node IN1500.

Circuit 1500 further comprises, between terminal SUPPLY and terminal SGND, a resistor R1501 and a flip-flop C1501 (CLAMP). A first terminal of resistor R1501 is coupled, preferably connected, to terminal SUPPLY, and a second terminal of resistor R1501 is coupled, preferably connected, to a first terminal of flip-flop C1501. The second terminal of flip-flop C1510 is coupled, preferably connected, to terminal SGND.

Circuit 1500 operates as follows. When the voltage between the gate and the source of transistor T1501 is greater than the threshold voltage of transistor T1501, then transistor T1501 is conducting, and node IN1500 then receives the voltage originating from terminal SUPPLY, because transistor T1501 is a voltage follower transistor. Conversely, when the voltage between the gate and the source of transistor T1501 is smaller than the threshold voltage of transistor T1501, then transistor T1501 no longer conducts, and node IN1500 then receives the current originating from terminal VCC.

Thus, when the voltage delivered by terminal VCC exceeds the difference between the voltage between the terminal of flip-flop C1501 and the threshold voltage of transistor T1501, then the power supply of circuit 1550 is modified to originate from terminal VCC and no longer from terminal SUPPLY. This enables to avoid too high a power consumption from terminal SUPPLY. Clamp C1501 is sized so that transistor T1501 remains on until the voltage on terminal SUPPLY exceeds a threshold. Terminal SUPPLY furnishes at least a current in the order of 40 μA, corresponding to the current crossing resistor R1501.

Figure 36:
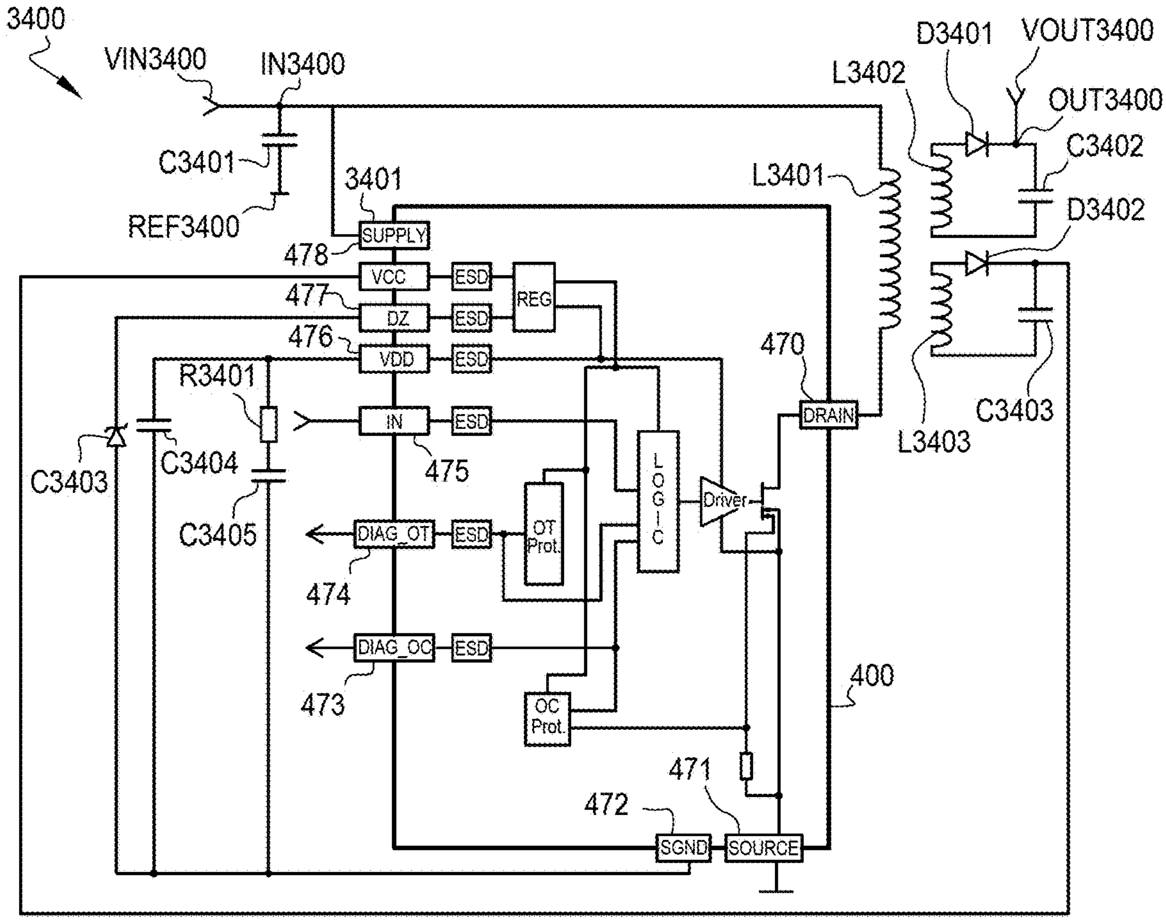
FIG. 36 partially and schematically shows in the form of blocks an electric diagram of a third embodiment of an application of the embodiment of FIG. 4.

This embodiment is used in the embodiment described in relation with FIG. 36.

Figure 16:
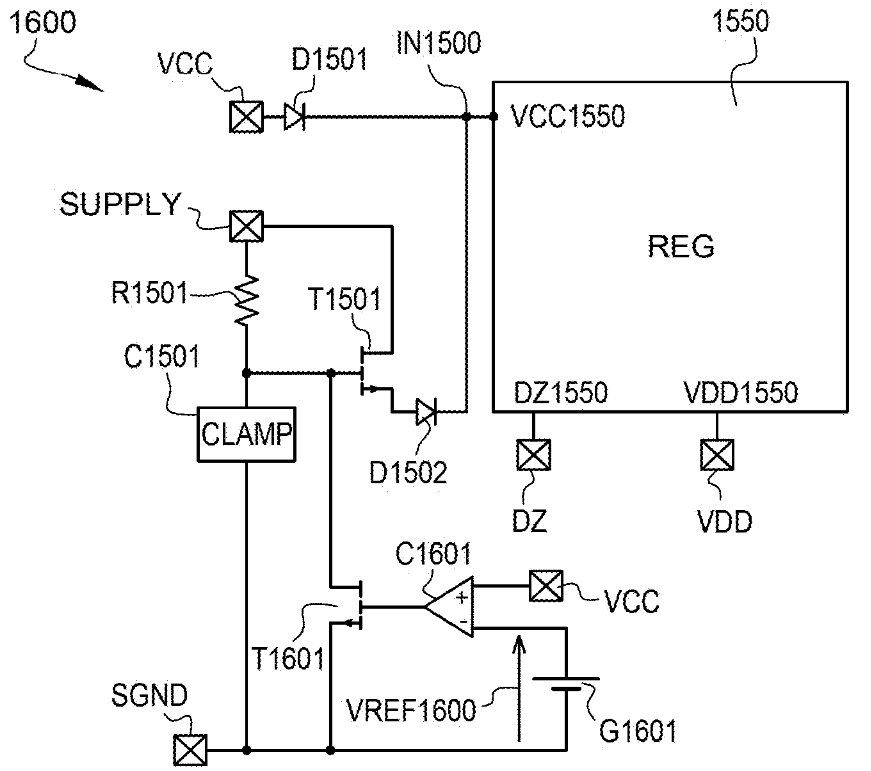
FIG. 16 shows an electric diagram of a second embodiment of a high voltage regulator circuit of the embodiment of FIG. 4.

FIG. 16 shows a second embodiment of a high-voltage regulation circuit 1600, or high voltage regulator circuit 1600, adapted to forming part of the device 400 described in relation with FIG. 4.

Circuit 1600 has elements common with the circuit 1500 of FIG. 15. These elements will not be described again and only the differences between circuits 1500 and 1600 will be highlighted.

Circuit 1600 comprises all the components of circuit 1500 but further comprises a circuit for controlling transistor T1501, arranged between the gate of transistor T1501 and terminal SGND.

The control circuit comprises a transistor T1601 of e-mode type, a comparator C1601, and a voltage source G1601. The drain of transistor T1601 is coupled, preferably connected, to the gate of transistor T1501, and the source of transistor T1501 is coupled, preferably connected, to terminal SGND. The gate of transistor C1601 receives an output voltage from comparator C1601. The comparator receives as an input the voltage of terminal VCC and a reference voltage VREF1600 delivered by voltage source G1601. An example of embodiment of comparator C1601 is described in relation with FIG. 17.

Circuit 1600 operates as follows. When the voltage of terminal VCC is smaller than reference voltage VREF1600, which occurs at the start-up moment of device 400, a current originating from terminal SUPPLY is supplied by transistor T1501, transistor T1501 being conducting due to the dimensions of resistor R1501. In fact, resistor R1501 has a pretty high resistance in order to decrease the energy consumption of device 400, for example a resistance of 10 MOhm. Current I(R1501) flowing through resistor R1501 is given by the following mathematical formula:

$$I(R1501) = \frac{V(\text{SUPPLY}) - V(\text{CLAMP})}{R1501} \quad \text{Math 7}$$

wherein:

V(SUPPLY) is the voltage in terminal SUPPLY;

V(CLAMP) is the voltage between the terminals of clamp C1501; and

R1501 is the resistance of resistor R1501.

When the voltage of terminal VCC is greater than reference voltage VREF1600, meaning when the supply circuits of device 400 are started and are able to provide a supply voltage. transistor T1501 is no longer conducting and node IN1500 receives a voltage from terminal VCC.

Figure 17:
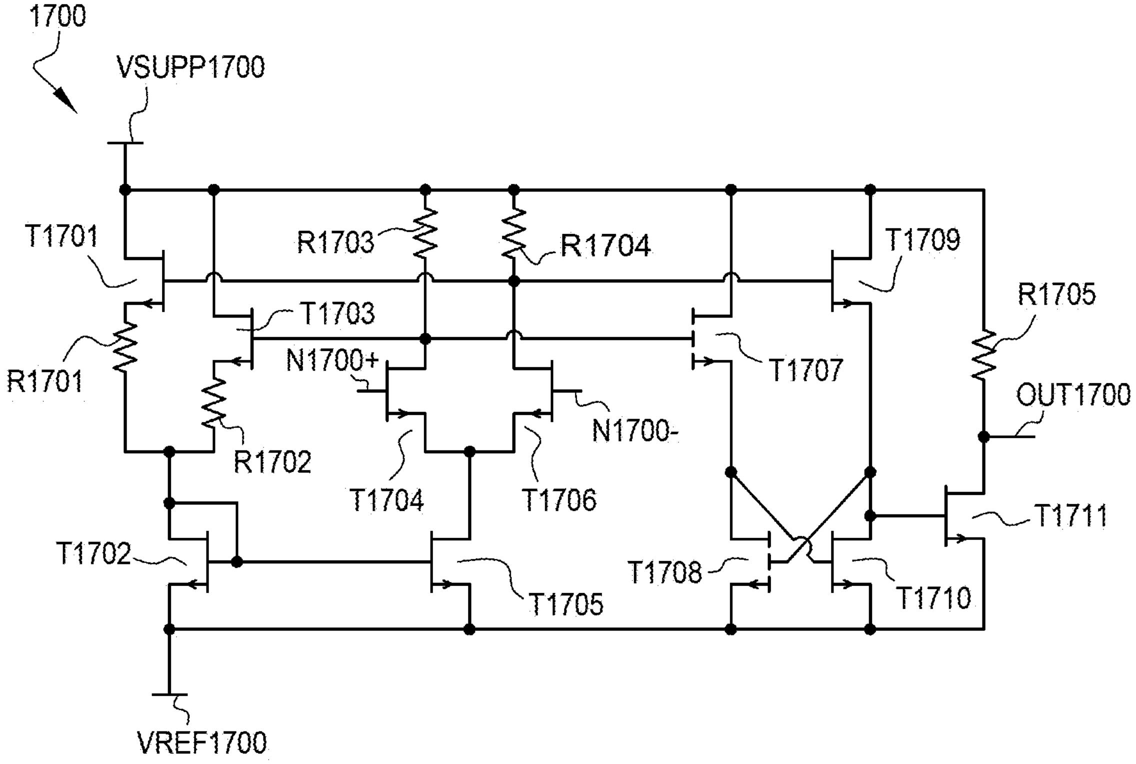
FIG. 17 shows an electric diagram of an example of embodiment of a comparator of the embodiment of FIG. 16.

FIG. 17 shows an example of embodiment of a comparator circuit 1700 capable of being used as a comparator C1601 in the circuit 1600 of FIG. 16.

Comparator circuit 1700 comprises two power supply nodes VSUPP1700 and VREF1700, two input nodes N1700+ and N1700–, and an output node OUT1700. Power supply node VSUPP1700 receives a voltage greater than the voltage received by node VREF1700, for example power supply node VSUPP receives a voltage in the order of 6 V and node VREF1700 receives a voltage in the order of 0 V. Input nodes N1700+ and N1700– receive the voltages to be compared. Node OUT1700 delivers the voltage representing the result of the comparison of the voltages received by nodes N1700+ and N1700–.

Circuit 1700 comprises, between nodes VSUPP1700 and VREF1700, and on a first branch, a d-mode type transistor T1701, a resistor R1701, and a d-mode type transistor T1702. The drain of transistor T1701 is coupled, preferably connected, to node VSUPP1700, and the source of transistor T1701 is coupled, preferably connected, to a first terminal of resistor R1701. The second terminal of resistor R1701 is coupled, preferably connected, to the drain and to the gate of transistor T1702. The source of transistor T1702 is coupled, preferably connected, to node VREF1700.

Circuit 1700 further comprises, between node VSUPP1700 and the middle node between resistor R1701 and transistor T1702, and on a second branch, a d-mode type transistor T1703 and a resistor R1702. The drain of transistor T1703 is coupled, preferably connected, to node VSUPP1700 and the source of transistor T1703 is coupled, preferably connected, to a first terminal of resistor R1702. The second terminal of resistor R1702 is coupled, preferably connected, to the middle node between resistor R1701 and transistor T1702. According to a variant, transistors T1701 and T1702 can be transistors of e-mode type.

Circuit 1700 comprises, between nodes VSUPP1700 and VREF1700, and on a third branch, a resistor R1703, a d-mode type transistor T1704, and a d-mode type transistor T1705. A first terminal of resistor R1703 is coupled, preferably connected, to node VSUPP1700 and the second terminal of resistor R1703 is coupled, preferably connected, to the drain of transistor T1704 and to the gate of transistor T1703. The source of transistor T1704 is coupled, preferably connected, to the drain of transistor T1705. The source of transistor T1705 is coupled, preferably connected, to node VREF1700. The gate of transistor T1704 is coupled, preferably connected, to node N1700+.

Circuit 1700 comprises, between nodes VSUPP1700 and VREF1700, and on a fourth branch, a resistor R1704, a d-mode type transistor T1706, and transistor T1705. A first terminal of resistor R1704 is coupled, preferably connected, to node VSUPP1700 and the second terminal of resistor R1704 is coupled, preferably connected, to the drain of transistor T1706 and to the gate of transistor T1701. The source of transistor T1706 is coupled, preferably connected, to the drain of transistor T1705. The gate of transistor T1706 is coupled, preferably connected, to node N1700–.

Circuit 1700 comprises, between nodes VSUPP1700 and VREF1700, and on a fifth branch, a e-mode type transistor T1707 and a e-mode type transistor T1708. The drain of transistor T1707 is coupled, preferably connected, to node VSUPP1700, and the source of transistor T1707 is coupled, preferably connected, to the drain of transistor T1708. The source of transistor T1708 is coupled, preferably connected, to node VREF1700. The gate of transistor T1707 is coupled, preferably connected, to the gate of transistor T1703.

Circuit 1700 comprises, between nodes VSUPP1700 and VREF1700, and on a sixth branch, a d-mode type transistor T1709 and a d-mode type transistor T1710. The drain of transistor T1709 is coupled, preferably connected, to node VSUPP1700, and the source of transistor T1709 is coupled, preferably connected, to the drain of transistor T1710. The source of transistor T1710 is coupled, preferably connected, to node VREF1700. The gate of transistor T1709 is coupled, preferably connected, to the gate of transistor T1701.

According to a first embodiment, illustrated in FIG. 17, the gate of transistor T1708 is coupled, preferably connected, to the drain of transistor T1710 and the gate of transistor T1710 is coupled, preferably connected, to the drain of transistor T1708.

According to a second embodiment, not illustrated in FIG. 17, the gates of transistors T1708 and T1710 are coupled, preferably connected, together and to the drain of transistor T1708.

Circuit 1700 comprises, between nodes VSUPP1700 and VREF1700, and on a seventh and last branch, a resistor R1705 and a d-mode type transistor T1711. A first terminal of resistor R1705 is coupled, preferably connected, to node VSUPP1700 and a second terminal of resistor R1705 is coupled, preferably connected, to output node OUT1700. The drain of transistor T1711 is coupled, preferably connected, to node OUT1700 and the source of transistor T1711 is coupled, preferably connected, to node VREF1700. The gate of transistor T1711 is coupled, preferably connected, to the drain of transistor T1710.

Transistors T1704 and T1705 are differential input transistors. Resistors R1701 and R1702 are biasing resistors. Transistors T1701, T1702, T1703, and T1705 are biasing transistors. Transistors T1707 and T1709 are voltage follower transistors. Transistors T1708 and T1710 are current comparators. The seventh branch is an output branch.

Comparator circuit 1700 functions as follows. When the gate voltage of transistor T1706 is superior to the gate voltage of transistor T1704, then the gate voltage of transistor T1709 becomes inferior to the gate voltage of transistor T1707, which causes the gate voltage of transistor T1711 to become inferior to the threshold voltage of transistor T1711. Output voltage VOUT1700 is then coupled to voltage VSUPP1700.

FIGS. 18 to 21(B) partially and schematically show in the form of blocks embodiments of circuits capable of being an overtemperature protection circuit 454 described in relation with FIG. 4.

Figure 18:
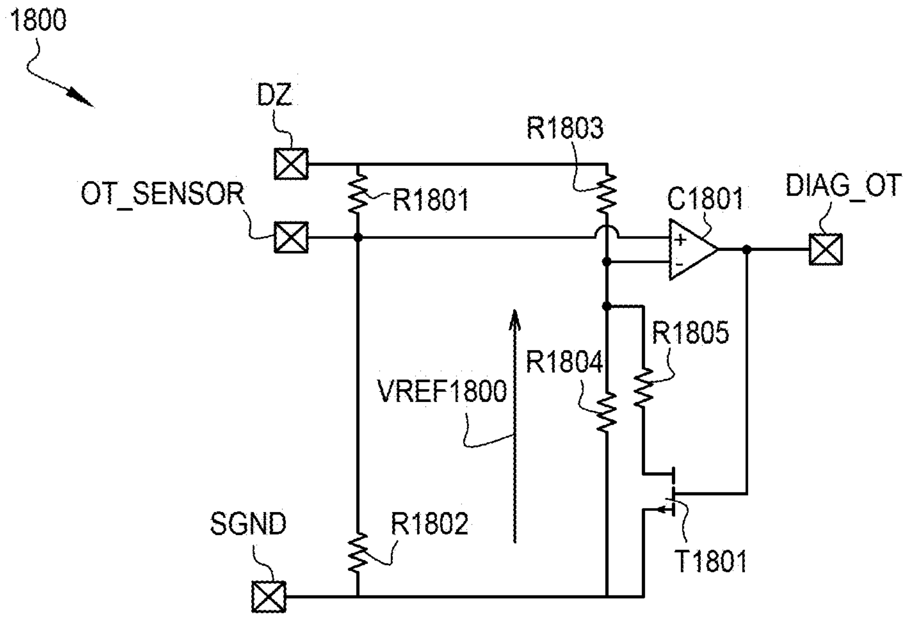
FIG. 18 shows an electric diagram of a first embodiment of an overtemperature protection circuit of the embodiment of FIG. 4.

FIG. 18 is an electric diagram of a first embodiment of an overtemperature protection circuit 1800 adapted to forming part of device 400.

Overtemperature protection regulation circuit 1800 is adapted to being coupled to four connection terminals of device 400, and more particularly:

- to terminal DZ corresponding to the connection terminal 477 of device 400 delivering a positive power supply voltage, for example, in the order of 6 V;
- to a terminal OT_SENSOR corresponding to a inner diagnosis connection terminal of device 400, this terminal is optional;
- to reference terminal SGND corresponding to the reference connection terminal 472 of device 400; and
- to a diagnosis terminal DIAG_OT corresponding to the connection terminal 474 of device 400.

Circuit 1800 comprises, between terminals DZ and SGND, and on a first branch, two resistors R1801 and R1802. A first terminal of resistor R1801 is coupled, preferably connected, to terminal DZ, and a second terminal of resistor R1801 is coupled, preferably connected, to terminal OT_SENSOR. A first terminal of resistor R1802 is coupled, preferably connected, to terminal OT_SENSOR and a second terminal of resistor R1802 is coupled, preferably connected, to terminal SGND. According to a variant, terminal DZ can be replaced by terminal VDD.

According to an embodiment, resistors R1801 and R1802 have different temperature coefficients. Resistor R1802 has a positive temperature coefficient and is positioned in an active area of the device comprising protection circuit 1800, for example at the level of power transistor 401. This will be described in further detail in relation with FIG. 20.

According to a first embodiment, resistor R1801 has a zero temperature coefficient. Resistor R1801 may be a resistor made of a silicon and chromium alloy. In this case, resistor R1801 is not formed at the same level as resistor T1802. In particular, resistor R1802 may be formed in the metallization levels of the structure having device 400 formed inside and on top of it, at the level of control circuit 450, as it is described in relation with view (B) of FIG. 7(B). This embodiment is described in further detail in relation with FIG. 20.

According to a second embodiment, the temperature coefficient of resistor R1801 may be positive or negative but always different from the temperature coefficient of resistor R1801. In this case, resistor R1801 may be positioned close to resistor R1802 in device 400.

Circuit 1800 comprises, between terminals DZ and SGND, and on a second branch, two resistors R1803 and R1804. A first terminal of resistor R1803 is coupled, preferably connected, to terminal DZ and a second terminal of resistor R1803 is coupled, preferably connected, to a first terminal of resistor R1804. A second terminal of resistor R1804 is coupled, preferably connected, to terminal SGND. According to an embodiment, resistors R1803 and R1804 are of the same type as resistor R1801.

Circuit 1800 further comprises a comparator circuit C1801, of the type of the comparator circuit 1700 described in relation with FIG. 17. Comparator circuit C1801 comprises a first input terminal (+) coupled, preferably connected, to terminal OT_SENSOR, and a second input terminal (−) coupled, preferably connected, to the middle node between resistors R1803 and R1804. Comparator circuit C1801 comprises an output coupled, preferably connected, to terminal DIAG_OT. Comparator circuit C1801 further comprises power supply terminals, not shown.

Circuit 1800 comprises, between the middle node between resistors R1803 and R1804 and terminal SGND, and on a third branch, a resistor R1805 and a transistor T1801 of e-mode type. A first terminal of resistor R1805 is coupled, preferably connected, to the middle node between resistors R1803 and R1804, and a second terminal of resistor R1805 is coupled, preferably connected, to the drain of transistor T1801. The source of transistor T1801 is coupled, preferably connected, to terminal SGND. The gate of transistor T1801 is coupled, preferably connected, to the output of comparator circuit C1801.

Circuit 1800 operates as follows. When the temperature near resistor R1802 increases, voltage at the terminals of resistor R1802 increase and voltage at the terminals of resistor R1801 does not change. Then voltage between terminals OT_SENSOR and SGND increases, and if it exceeds a reference voltage VREF1800, output voltage of comparator circuit C1801 increases, which causes the decrease of output voltage, meaning the voltage between terminals DIAG_OT and SGND. The reference voltage VREF1800 is obtained by the voltage dividing bridge formed by resistors R1803 and R1804, and by the hysteresis formed by transistor T1801 and resistor R1805.

Figure 19:
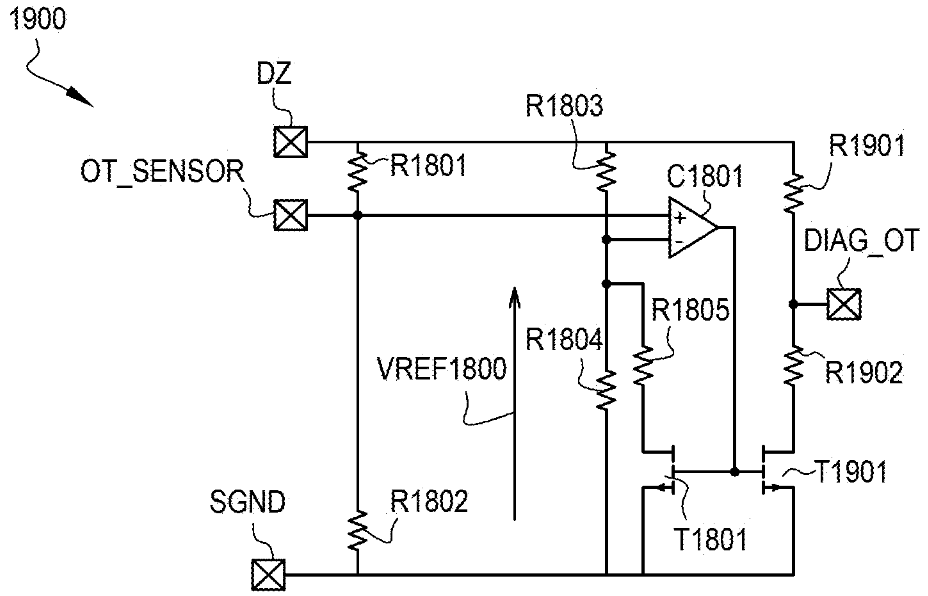
FIG. 19 shows an electric diagram of a second embodiment of an overtemperature protection circuit of the embodiment of FIG. 4.

FIG. 19 shows a second embodiment of an overtemperature protection circuit 1900 adapted to forming part of the device 400 described in relation with FIG. 4.

Circuit 1900 has elements common with the circuit 1800 of FIG. 18. These elements will not be described again and only the differences between circuits 1800 and 1900 will be highlighted.

Circuit 1900 comprises all the components of circuit 1800 but further comprises a fourth branch of components between terminals DZ and SGND. Further, in circuit 1900, the output of comparator circuit C1801 is coupled, preferably connected, only to the gate of transistor T1801 and no longer to terminal DIAG_OT.

Said fourth branch comprises two resistors R1901 and R1902, and a transistor T1901 of e-mode type. A first terminal of resistor R1901 is coupled, preferably connected, to terminal DZ and a second terminal of resistor R1901 is coupled, preferably connected, to terminal DIAG_OT. A first terminal of resistor R1902 is coupled, preferably connected, to terminal DIAG_OT and a second terminal of resistor R1902 is coupled, preferably connected, to the drain of transistor T1901. Resistors R1901 and R1902 have both positive temperature coefficient. The source of transistor T1901 is coupled, preferably connected, to terminal SGND. The gate of transistor T1901 is coupled, preferably connected, to the gate of transistor T1801 and to the output of comparator circuit C1801.

Circuit 1900 operates as follows. When the temperature at the level of resistor R1802 increases, the voltage across resistor R1802 increases and the voltage across resistor R1801 does not change. The voltage between terminals OT_SENSOR and SGND then increases and if it exceeds reference voltage VREF1800, the output voltage of comparator circuit C1801 increases, which causes the decrease of the output voltage, that is, the voltage between terminals DIAG_OT and SGND, also decreases.

Moreover, resistors R1901, R1902 and transistor T1901 form a buffer element that allows to furnish the information of the appearance of an overheating or an overvoltage to a controller, for ex a microcontroller. Resistor R1902 is used to limit the current flowing through transistor T1901. In fact, in a certain functioning mode of device 400, circuit 1900 can be passed by if the user of the device does not want to have access to the overheating protection. In this case, if output terminal DIAG_OT is coupled, for example connected, to terminal DZ or to terminal VDD, resistor R1902 allows to reduce the output voltage DIAG_OT.

Figure 20:
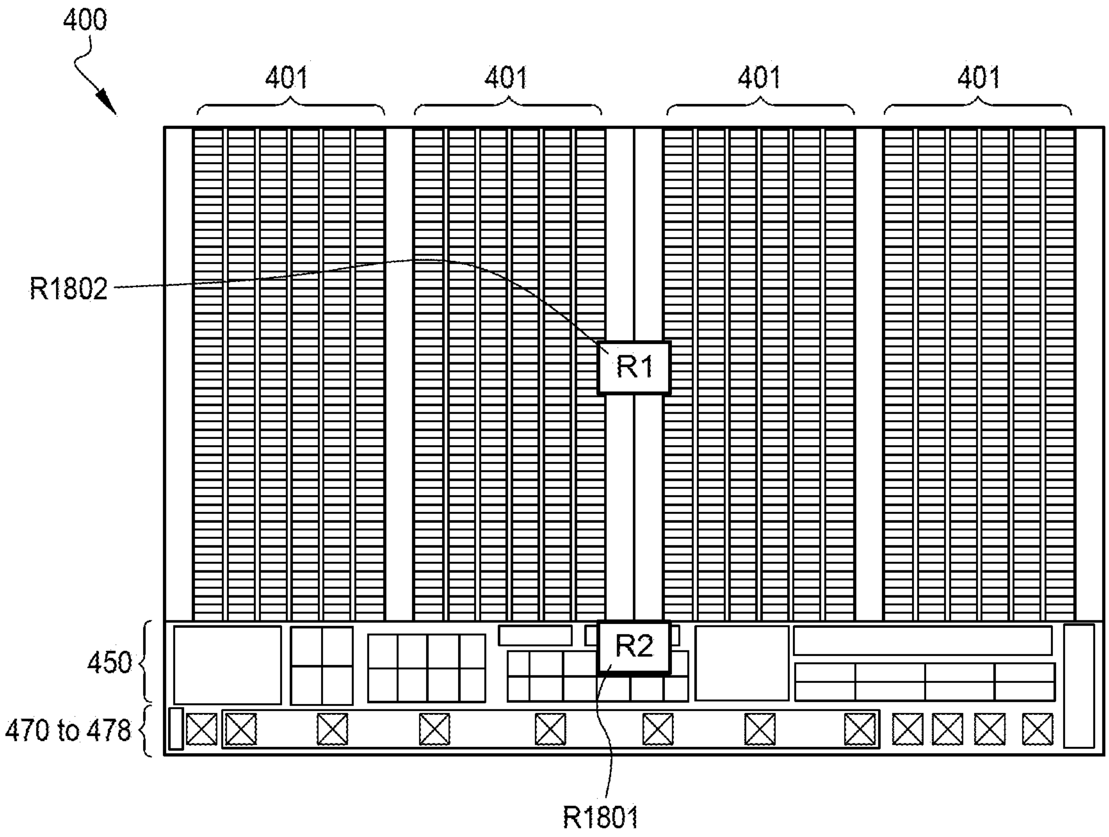
FIG. 20 shows a simplified top view of the embodiment of FIG. 4.

FIG. 20 is a top view of the same practical example of embodiment of the device 400 described in relation with FIG. 6, where the positioning of resistors R1801 and R1802 is shown according to the first embodiment described in relation with FIG. 18.

As previously described, resistor R1801 has a zero temperature coefficient and is placed at the level of control circuit 450 (location R2 in FIG. 20) to be impacted as little as possible by a possible temperature increase of transistor 401.

Resistor R1802 has a positive temperature coefficient and is placed at the level of transistor 401 (location R1 in FIG. 20) to see the same variation of the temperature than transistor 401. Thus, resistor R1802 sees the voltage thereacross increase in case of an overtemperature protection of transistor 401.

Figure 21A:
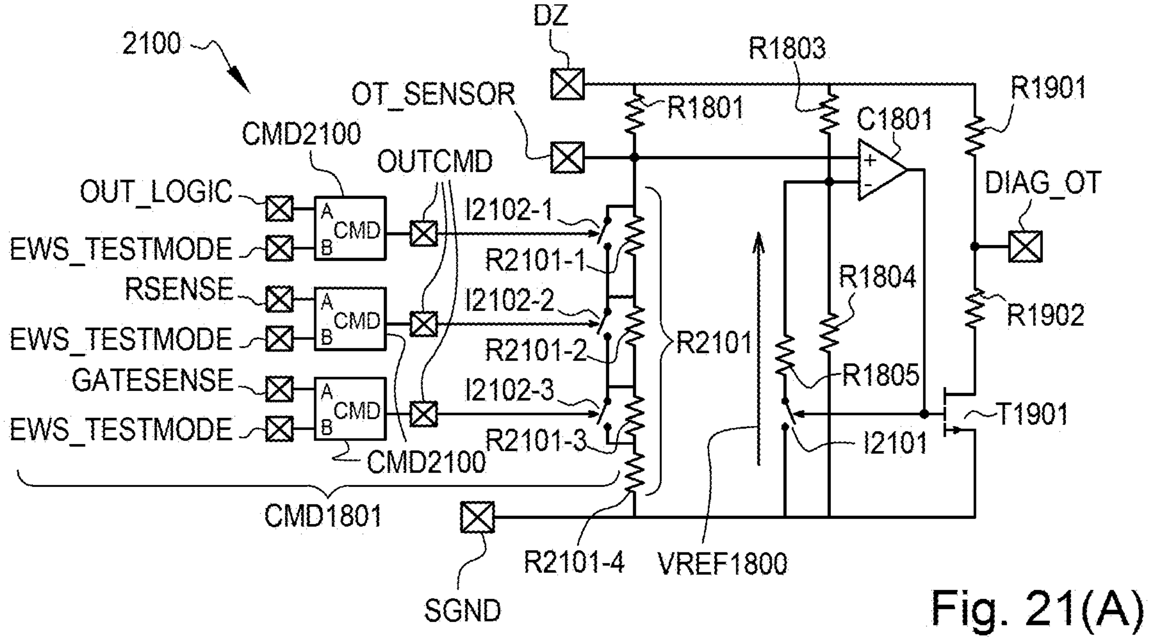
FIGS. 21(A) and 21(B) are an electric diagram of a third embodiment of an overtemperature protection circuit of the embodiment of FIG. 4.
Figure 21B:
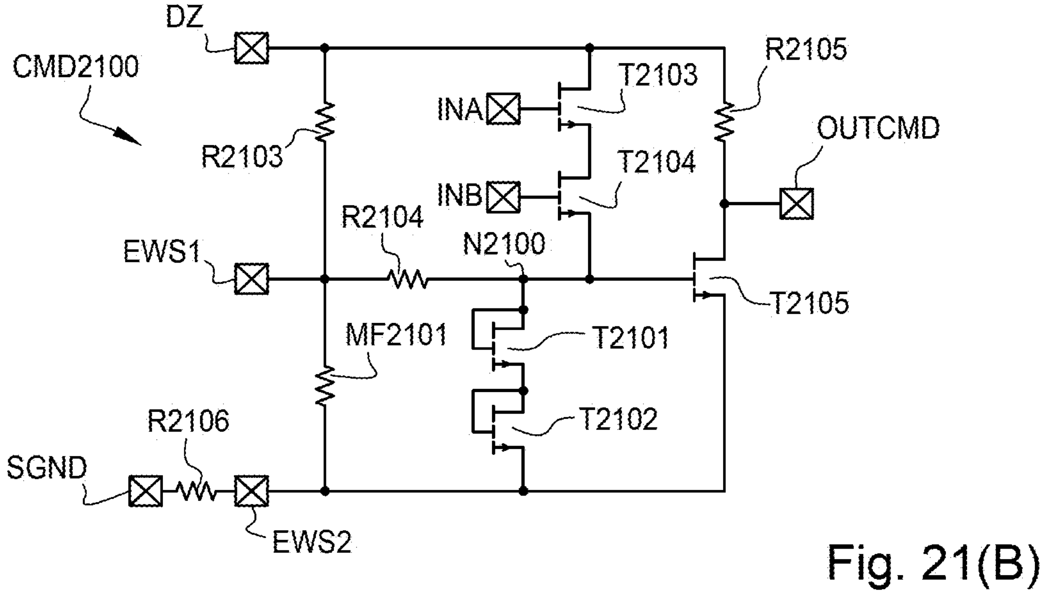

FIGS. 21(A) and 21(B) show a third embodiment, and a preferred embodiment, of an overtemperature protection circuit 2100 adapted to forming part of the device 400 described in relation with FIG. 4. FIG. 21(A) illustrates, partially in a block form, the overtemperature protection circuit 2100, and FIG. 21(B) illustrates, a part of overtemperature protection circuit 2100.

Circuit 2100 has elements common with the circuit 1800 of FIG. 18 and the circuit 1900 of FIG. 19. These elements are not described again and only the differences between circuits 1800, 1900, and 2100 will be highlighted.

Circuit 2100 comprises most of the components of circuit 1900 but comprises, instead of resistor R1802, a resistor with a modifiable resistance and its control circuit CMD1801. Further, in circuit 2100, transistor T1801 is replaced with a switch 11201 comprising a control terminal coupled, preferably connected, only to the gate of transistor T1901 and no longer to terminal DIAG_OT.

In FIGS. 21(A) and 21(B), resistor R2101 is formed by four resistors R2101-1 to R2101-4, having three resistors R2101-1 to R2101-3 selectable via switches 12102-1 to 12102-3. According to an example, switches 12102-1 to 12102-3 are implemented by e-mode type transistors. Those skilled in the art will be able to adjust the number of resistors forming resistor R2101 to the number necessary for its application.

More particularly, resistors R2101-1, R2101-2, R2101-3, and R2101-4 are series-coupled between terminals OT_SENSOR and SGND. Switch 12102-1 is coupled, preferably connected, in parallel with resistor R2101-1 so that if switch 12102-1 is conducting, resistor R2101-1 is shorted. Similarly, switch 12102-2 is coupled, preferably connected, in parallel with resistor R2101-2, and switch 12102-3 is coupled, preferably connected, in parallel with resistor R2101-3. According to an example, switches 12101-1 to 12101-3 are transistors.

Switches 12102-1 to 12102-3 are each piloted by a command circuit CMD2100 detailed in relation with view (B) of FIG. 21(B). Command circuit CMD2100 comprises two test input terminals INA and INB, and an output terminal OUTCMD providing a command voltage.

According to a variant, some command circuits can be coupled to the command terminal of switches 12102-1 to 12102-3 by an inverter circuit (not represented in FIGS. 21(A) and 21(B)).

Command circuit CMD2100 is also coupled to terminals DZ, SGN, and to test terminals EWS1 and EWS2. Command circuit CMD2100 comprises a resistor R2103 disposed between terminals DZ and EWS1, a resistor R2105 disposed between terminals DZ and OUTCMD, and a resistor R2106 disposed between terminals SGND and EWS2.

Command circuit CMD2100 further comprises, a metal fuse MF2101 disposed between terminals EWS1 and EWS2. Metal fuse MF2101 allows to define in a permanent manner the value of resistor R2101. A more detailed example of metal fuse 2100 is described in relation with FIG. 22.

Command circuit CMD2100 comprises two transistors T2101 and T2102 of e-mode type. Source and gate of transistors T2101 are coupled, preferably connected, to the source and the gate of transistor T2102. Drain of transistor T2102 is coupled, preferably connected, to terminal EWS2.

Command circuit CMD2100 comprises two transistors T2103 and T2104 of e-mode type, these transistors are test transistors. Source of transistor T2103 is coupled, preferably connected, to terminal DZ. Drain of transistor T2103 is coupled, preferably connected, to the source of transistor T2104. Gate of transistor T2103 is coupled, preferably connected, to terminal INA. Drain of transistor T2104 is coupled, preferably connected, to node N2100. Gate of transistor T2103 is coupled, preferably connected, to terminal INA. Gate of transistor T2104 is coupled, preferably connected, to terminal INB.

Command circuit CMD2100 further comprises a resistor T2104 and a transistor T2105. Resistor R214 is disposed between terminal EWS1 and node N2100. Source of transistor T2105 is coupled, preferably, to output terminal OUTCMD. Drain of transistor T2105 is coupled, preferably connected, to EWS2 terminal. Gate of transistor T2105 is coupled, preferably connected, to node N2100.

Command circuit CMD2100 piloting switch T2101-1 receives on its terminal INA voltage OUT_LOGIC, and on its terminal INB test voltage EWS_TESTMODE. Command circuit CMD2100 piloting switch T2101-2 receives on its terminal INA voltage RSENSE, and on its terminal INB test voltage EWS_TESTMODE. Command circuit CMD2100 piloting switch T2101-3 receives on its terminal INA voltage GATE_SENSE, and on its terminal INB test voltage EWS_TESTMODE.

Circuit 2100 operates the same way has circuit 1900, but comprises also a programming phase of the value of resistor T2101. Programming phase comprises two steps, an estimation step, and a programming step.

During the estimation step, command circuits CMD2100 use transistors T2103 and T2104 to pilot transistor T2105, and then to pilot the output voltage OUTCMD. Several values of resistor R2101 are then tested to see which one corresponds most. This step is typically executed during the fabrication of device 400.

During the programming step, metal fuse MF2101 are programmed to be on or off in function of the value determined during the previous step.

Allowing to program the value of resistor R2101 allows to give more precision to the overtemperature detection.

Figure 22:
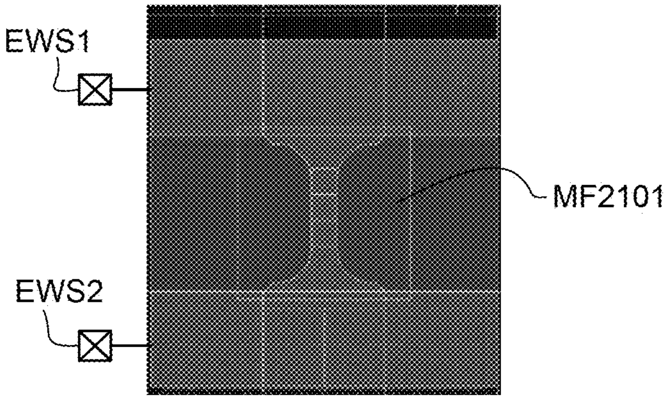
FIG. 22 is a cross-section view showing a metal fuse of the embodiment of FIGS. 21(A) and 21(B)

FIG. 22 is a cross section view illustrating an embodiment of a metal fuse of type of metal fuse MF2101 described in relation with FIGS. 21(A) and 21(B).

Metal fuse is formed between to metallization levels of device 400, and has a form of hourglass.

When a current, superior to a threshold current, is applied between terminals EWS1 and EWS2, metal forming the metal fuse in broken. If the metal fuse is open, or non-conductive, then the voltage on the gate of transistor T2104 is increased to a level equal to the sum of the threshold voltages of transistors T2101 and T2102, because of that transistor T2104 is conductive. Thus, output terminal OUTCMD is coupled to reference terminal SGND.

FIGS. 23 to 26 partially and schematically show in the form of blocks embodiments of circuits capable of being a driver 451 described in relation with FIG. 4.

Figure 23:
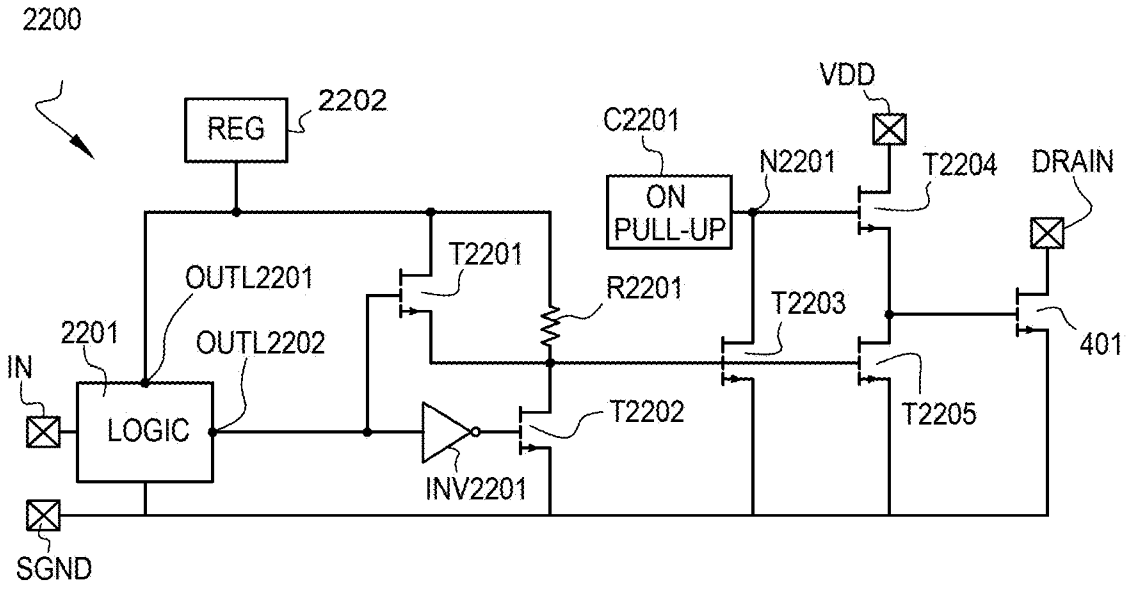
FIG. 23 shows an electric diagram of a first embodiment of a driver of the embodiment of FIG. 4.

FIG. 23 is an electric diagram of a first embodiment of a driver 220 adapted to forming part of the device 400 described in relation with FIG. 4. Driver 2200 forms the logic circuits 452 and the driver 451 of device 400.

Driver 2200 is adapted to being coupled to four connection terminals of device 400, and more particularly:

- to an input terminal IN corresponding to the connection terminal 475 of device 400; to terminal VDD corresponding to the connection terminal 476 of device 400;
- to reference terminal SGND corresponding to the reference connection terminal 472 of device 400; and
- to a terminal DRAIN corresponding to the drain terminal of the power transistor 401 of device 400.

Circuit 2200 comprises a logic circuit 2201 coupled to terminal IN and SGND, and comprises two output nodes OUTL2201 and OUTL2202. Logic circuit 2201 enables to transform a signal received on input terminal IN into a control instruction. According to an example, circuit 2201 may be a "NAND"-type logic gate. According to an example, output OUTL2201 transmits a supply voltage. According to an example, logic circuit 2201 further can receive as an input voltage DIAG_OT and VDS.

Circuit 2200 further comprises a voltage regulation circuit 2202 supplying a current to node OUTL2201. Circuit 2202 may one of the voltage regulation circuits described in relation with FIGS. 11 to 16 or one of their variants.

Circuit 2200 further comprises node OUTL22011 and terminal SGND a transistor T2201 of e-mode type coupled in parallel with a resistor R2201 and a transistor T2202 of e-mode type. More particularly, the drain of transistor T2201 and a first terminal of resistor R2201 are coupled, preferably connected, to node OUTL2201. The source of transistor T2201 and a second terminal of resistor R2201 are coupled, preferably connected, to the drain of transistor T2202. The source of transistor T2202 is coupled, preferably connected, to terminal SGND. The gate of transistor T2201 is coupled, preferably connected, to node OUTL2202.

Circuit 2200 further comprises an inverting gate INV2201 coupling node OUTL2202 to the gate of transistor T2202.

Circuit 2200 further comprises a triggering circuit C2201 (ON PULL UP) having an output coupled to a node N2201 and delivering a voltage high enough to control the power transistor 401 of device 400. Circuit C2201 is within the abilities of those skilled in the art.

Circuit 2200 further comprises an e-mode type transistor T2203 between node N2201 and terminal SGND. The drain of transistor T2203 is coupled, preferably connected, to node N2201 and the source of transistor T2203 is coupled, preferably connected, to terminal SGND. The gate of transistor T2203 is coupled, preferably connected, to the drain of transistor T2202.

Circuit 2200 further comprises, between terminals VDD and SGND, two e-mode type transistors T2204 and T2205. The drain of transistor T2204 is coupled, preferably connected, to terminal VDD and the source of transistor T2204 is coupled, preferably connected, to the drain of transistor T2205. The source of transistor T2205 is coupled, preferably connected, to terminal SGND. The gate of transistor T2204 is coupled, preferably connected, to node N2201. The gate of transistor T2205 is coupled, preferably connected, to the drain of transistor T2202. Transistor T2204 is a pull-up transistor, and transistor T2205 is a pull-down transistor.

Eventually, circuit 2200 is coupled to power transistor 401 as follows. The drain of transistor 401 is coupled, preferably connected, to terminal DRAIN and the source of transistor 401 is coupled, preferably connected, to terminal SGND. The gate of transistor 401 is coupled, preferably connected, to the middle node between transistors T2204 and T2205. Transistor 401 is a power transistor having its dimensions adapted so that it withstands a high voltage, for example, in the order of 650 V. Further, transistor T2205 is placed at closest to transistor 401 to favor the discharge of the gate of transistor 401 and/or to guarantee a good communication of the current between transistor T2205 and the gate of transistor 401. This is described in further detail in relation with FIG. 24.

Circuit 2200 operates as follows.

When the signal received by terminal IN is in a low state, the output of logic circuit 2201 is in a low state. Transistor T2201 does not conduct and transistor T2202 conducts. Transistors T2203 and T2205 are not conducting. Transistors T2204 is conducting. The power transistor 401 is then conducting.

When the signal received by terminal IN is in a high state, the output of logic circuit 2201 is in a high state. According to a variant, logic circuit 2201 could receive as an input, test voltages furnished by terminal DIAG_OT and DIAG_OC, if one of these voltages is at a high state then logic circuit output is at a high level. Transistor T2201 is conducting, and transistor T2202 does not conduct. Transistors T2203 and T2205 are conducting. Transistors T2204 is not conducting. The power transistor 401 is then not conducting.

Figure 24:
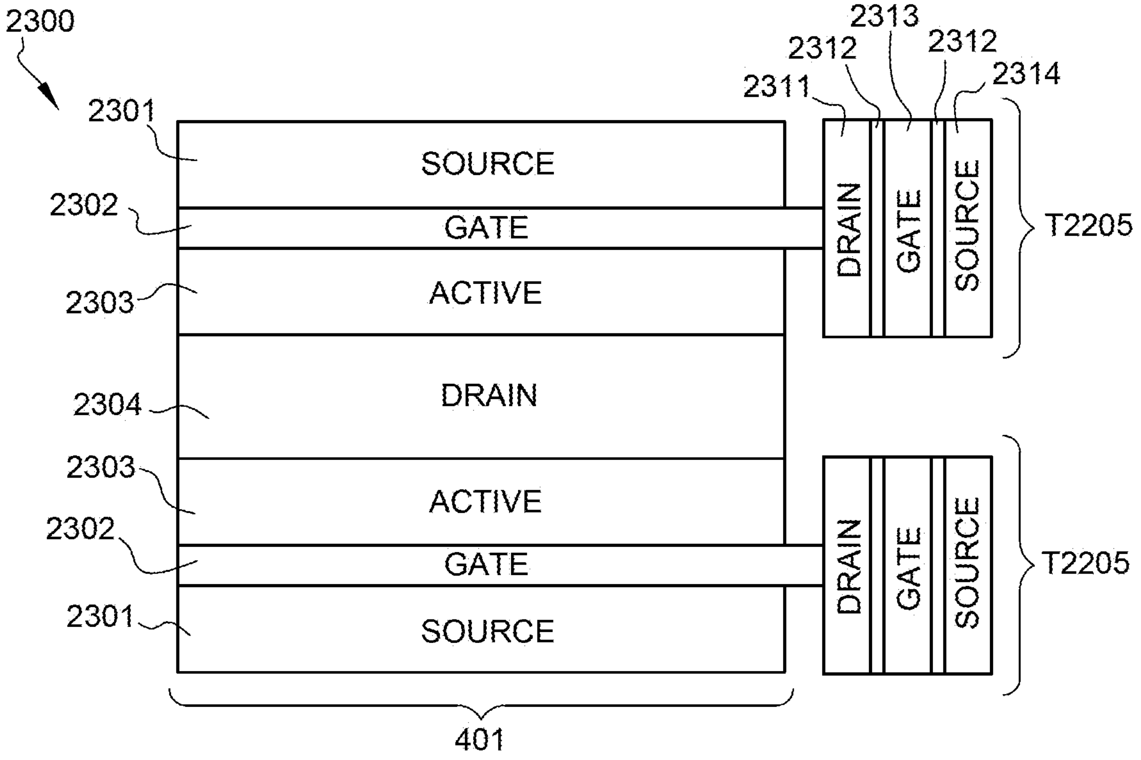
FIG. 24 shows a simplified top view of a portion of the driver of FIG. 23.

FIG. 24 is a simplified top view of a portion of device 400 comprising a portion of the driver 2200 described in relation with FIG. 23 and a portion of the power transistor 401.

In FIG. 24, transistor 401 is formed of an assembly of a plurality of e-mode type transistors such as described in relation with FIG. 5. These transistors each comprise source 2301 (SOURCE), gate 2303 (GATE), and drain 2304 (DRAIN) regions formed on an active region 2303 (ACTIVE) of a structure of the type of the structure 100 of FIG. 1.

Further, like transistor 401, transistor T2205 is also formed of an assembly of a plurality of transistors of the same type. These transistors each comprise source 2311 (SOURCE), gate 2312 (GATE), and drain 2314 (DRAIN) regions formed on an active region 2313 of the structure.

According to an embodiment, and to avoid as much as possible current losses, transistors T2205 are arranged at closest to transistor 401, and have for this purpose their drain regions 2311 in direct contact with the gate regions of transistor 401.

Figure 25:
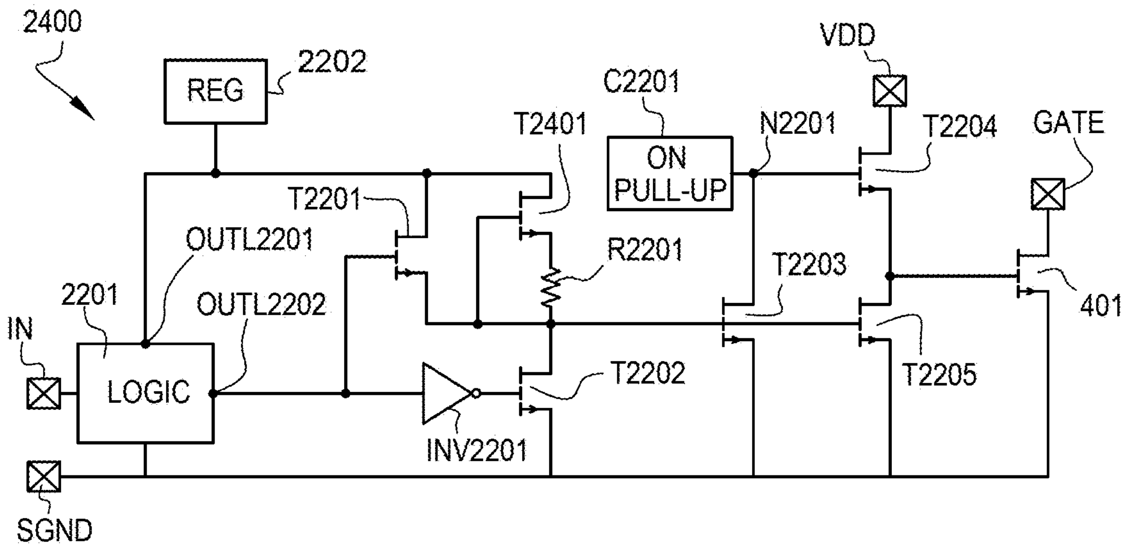
FIG. 25 shows an electric diagram of a second embodiment of a driver of the embodiment of FIG. 4.

FIG. 25 shows a second embodiment of a driver 2400, adapted to forming part of the device 400 described in relation with FIG. 4.

Circuit 2400 has elements common with the circuit 2200 of FIG. 23. These elements will not be described again and only the differences between circuits 2200 and 2400 will be highlighted.

Circuit 2400 differs from circuit 2200 in that it comprises a transistor T2401. The drain of transistor T2401 is coupled, preferably connected, to the drain of transistor T2201 and the source of transistor 2401 is coupled, preferably connected, to the first terminal of resistor R2201. The first terminal of resistor R2201 is then only coupled to the drain of transistor T2201 via transistor T2401, the second terminal of resistor R2201 being still coupled to the drain of transistor T2202. The gate of transistor 2401 is coupled, preferably connected, to the source of transistor T2201. Adding transistor T2401 enables to add a current source and to reduce the size of resistor R2201. The current provided is equal to the division of the threshold voltage of transistor T2401 by the resistance of resistor R2201.

Figure 26:
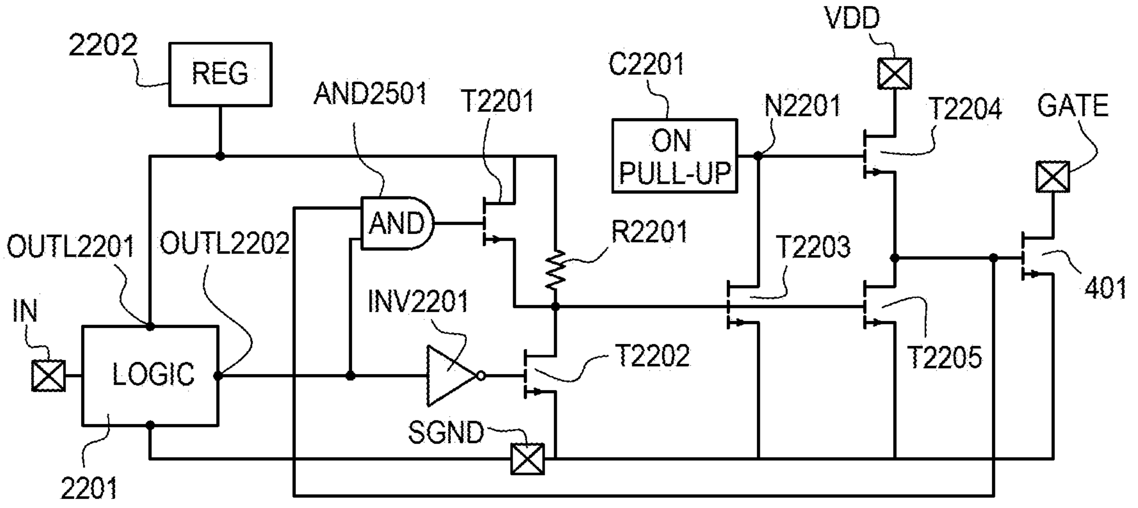
FIG. 26 shows an electric diagram of a third embodiment of a driver of the embodiment of FIG. 4.

FIG. 26 shows a second embodiment of a driver 2500, adapted to forming part of the device 400 described in relation with FIG. 4.

Circuit 2500 has elements common with the circuit 2200 of FIG. 23 and the circuit 2400 of FIG. 25. These elements are not described again and only the differences between circuits 2200, 2400, and 2500 will be highlighted.

Circuit 2500 differs from circuit 2200 in that it comprises an "AND"-type gate AND2501 enabling to control transistor T2201.

Gate AND2501 comprises two inputs, a first one being coupled to node OUTL2202 and a second one being coupled to the gate of transistor 401.

The adding of gate AND2501 enables to avoid the occurrence of a short-circuit at the level of transistors T2201 and T2202 during a transition from a high state to a low state of the voltage at the level of node OUTL2202.

Figure 27:
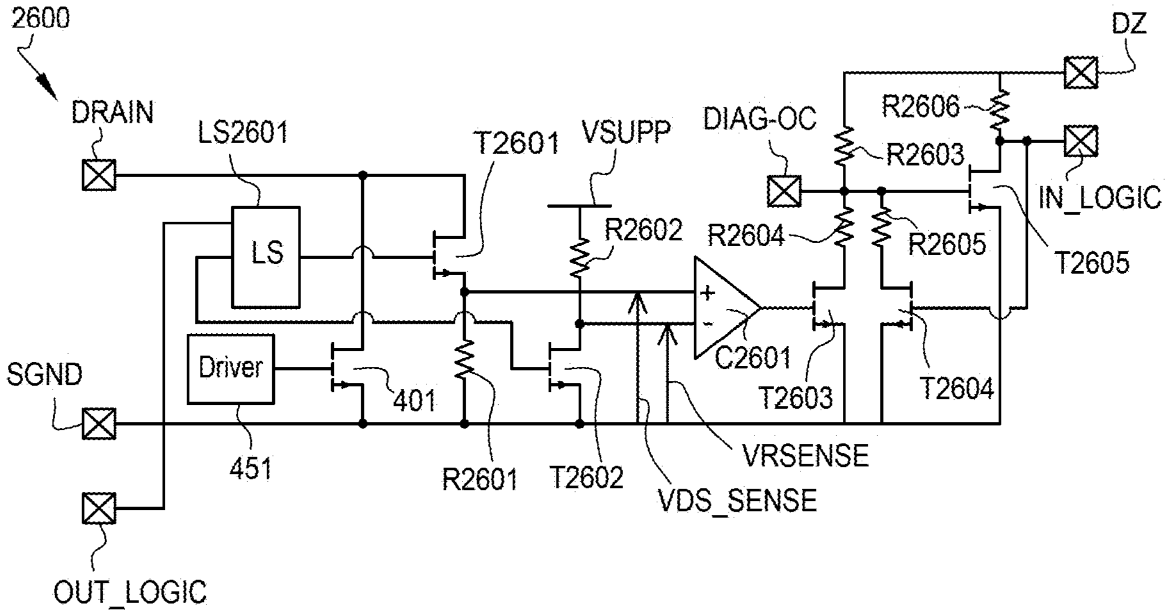
FIG. 27 shows an electric diagram of an embodiment of an overcurrent protection circuit of the embodiment of FIG. 4.
Figure 28:
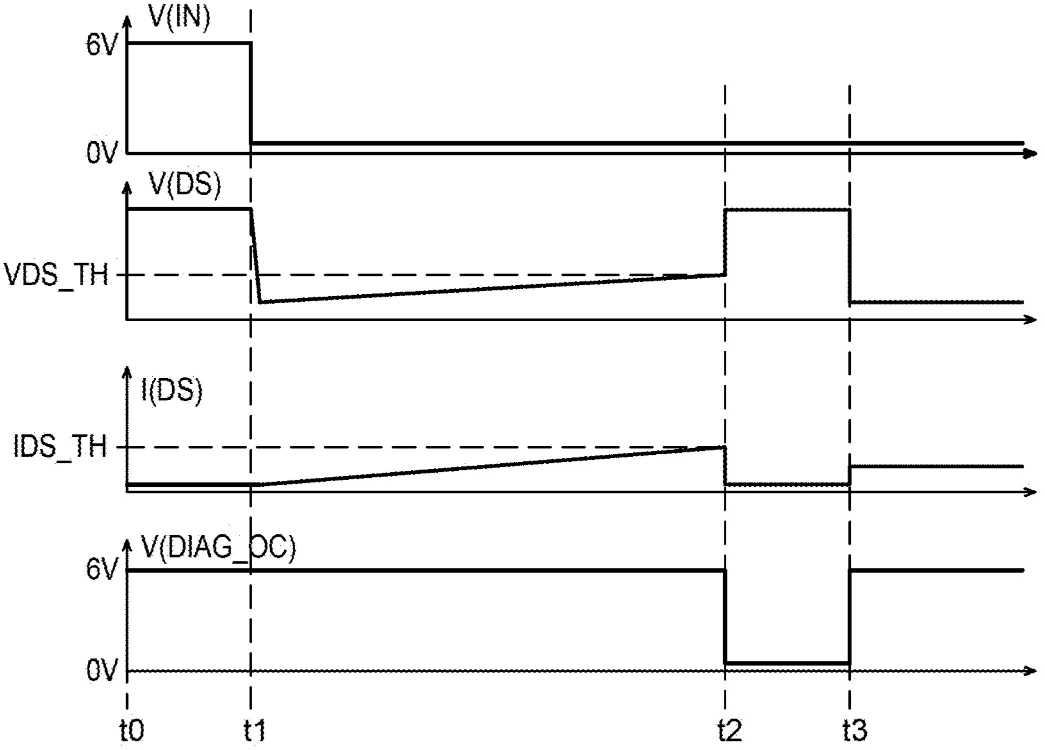
FIG. 28 comprises timing diagrams illustrating the operation of the circuit of FIG. 27.

FIGS. 27 to 29 schematically and partially show in the form of blocks an embodiment of a circuit capable of being an overcurrent protection circuit 453 described in relation with FIG. 4.

FIG. 27 is an electric diagram of an embodiment of an overcurrent protection circuit 2600 adapted to forming part of the device 400 described in relation with FIG. 4. Are shown in FIG. 27 overcurrent protection circuit 2600, the power transistor 401 and its driver 451 of device 400.

Overcurrent protection circuit 2600 is adapted to being coupled to five connection terminals of device 400, and more particularly:

- to a drain terminal DRAIN of transistor 401 corresponding to the connection terminal 470 of device 400;
- to reference terminal SGND corresponding to the reference connection terminal 472 of device 400; and
- to a reference terminal OUT_LOGIC corresponding to the inner output connection terminal 452OUT of the logic circuits 452 of device 400; and
- to a diagnosis terminal DIAG_OC corresponding to the diagnosis connection terminal 473 of device 400;
- to terminal DZ corresponding to the connection terminal 477 of device 400, or, according to a variant, to terminal VDD;
- to a terminal VSUPP corresponding to an inner power supply terminal of device 400; and
- to a terminal IN_LOGIC corresponding to the inner input connection terminal 452IN of the logic circuits 452 of device 400.

Power transistor 401 has its drain coupled, preferably connected, to terminal DRAIN and has its source coupled, preferably connected, to terminal SGND. Transistor 401 receives on its gate a control voltage from driver 451.

Circuit 2600 comprises a level shifter LS2601 (LS) comprising two inputs and one output. The first input of circuit 2600 is coupled, preferably connected, to terminal OUT_LOGIC.

Circuit 2600 further comprises, on a first branch between terminals DRAIN and SGND, an e-mode type transistor T2601 and a resistor R2601. The drain of transistor T2601 is coupled, preferably connected, to terminal DRAIN and the source of transistor T2601 is coupled, preferably connected, to a first terminal of resistor R2601. A second terminal of resistor R2601 is coupled, preferably connected, to terminal SGND. The gate of transistor T2601 is coupled, preferably connected, to the output of level shifter LS2601.

Circuit 2600 further comprises, on a second branch between terminals VSUPP and SGND, a resistor R2602 and an e-mode type transistor T2602. A first terminal of resistor R2602 is coupled, preferably connected, to terminal VSUPP and a second terminal or resistor R2602 is coupled, preferably connected, to the drain of transistor T2602. The source of transistor T2602 is coupled, preferably connected, to terminal SGND and the gate of transistor T2602 is coupled, preferably connected, to the second input of level shifter LS2601.

According to embodiment, transistor T2602 is a brother-like transistor to power transistor 401, meaning that transistor T2602 is a transistor having the same type as transistor 401, and, moreover, dimensions of transistor T2602 are about 10000 times smaller than the dimensions of transistor 401.

Transistors T2601 and T2602 are transistors adapted to high voltages, that is, adapted to withstanding between their source and their drain a voltage in the order of 650 V. Further, transistors 401 and T2602 are manufactured in parallel by implementing the same methods.

Circuit 2600 further comprises a comparator circuit C2601 adapted to comparing voltages of first and second branches. More particularly, comparator circuit C2601 comprises a first input (+) coupled, preferably connected, to the middle node between transistor T2601 and resistor R2601, and a second input (−) coupled, preferably connected, to the middle node between resistor R2602 and transistor T2602. A detailed example of a comparator circuit is described in relation with FIG. 17. Thus, the comparator circuit compares the voltage across resistor R2601, called voltage VDS_SENSE and the voltage across transistor T2602, called voltage RSENSE. Voltage RSENSE represents the reference voltage to which voltage VDS_SENSE is compared, and is given by the following mathematical formula:

$$VRSENSE = \frac{6 * R(T2602)}{R(T2602) + R2602} \quad \text{Math 8}$$

wherein:

R(T2602) represents the internal resistance of transistor T2602; and

R2602 represents the resistance of resistor R2602

Circuit 2600 further comprises, on a third branch between terminals DZ and SGND, two resistors R2603 and R2604 and a transistor T2603 of e-mode type. A first terminal of resistor R2603 is coupled, preferably connected, to terminal DZ, and a second terminal of resistor R2603 is coupled, preferably connected, to terminal DIAG_OC. A first terminal of resistor R2604 is coupled, preferably connected, to terminal DIAG_OC and a second terminal of resistor R2604 is coupled, preferably connected, to the drain of transistor T2603. The source of transistor T2603 is coupled, preferably connected, to terminal SGND and the gate of transistor T2603 is coupled, preferably connected, to the output of comparator circuit C2601.

Circuit 2600 further comprises, on a fourth branch between terminals DIAG_OC and SGND, a resistor R2605 and a transistor T2604 of e-mode type. A first terminal of resistor R2605 is coupled, preferably connected, to terminal DIAG_OC and a second terminal of resistor R2605 is coupled, preferably connected, to the drain of transistor T2604. The source of transistor T2604 is coupled, preferably connected, to terminal SGND and the gate of transistor T2604 is coupled, preferably connected, to terminal IN_LOGIC.

Circuit 260 further comprises, on a fifth branch between terminals DZ and SGND, a resistor R2606 and a transistor T2605 of e-mode type. A first terminal of resistor R2606 is coupled, preferably connected, to terminal DZ, and a second terminal of resistor R2606 is coupled, preferably connected, to the drain of transistor T2605 and to terminal IN_LOGIC. The source of transistor T2605 is coupled, preferably connected, to terminal SGND and the gate of transistor T2605 is coupled, preferably connected, to terminal DIAG_OC.

The operation of circuit 2600 is described in relation with FIG. 28.

FIG. 28 shows timing diagrams of voltages and current of circuit 2600 and of device 400.

More particularly, FIG. 26 comprises:

- an input voltage V(IN) representing the voltage at the level of the connection terminal 475 (IN) of device 400;
- a voltage V(DS) representing the voltage at the level of the conduction terminals of the power transistor 401 of device 400;
- a current I(DS) representing the current between the conduction terminals of the power transistor 401 of device 400; and
- a voltage V(DIAG_OC) representing the voltage across the diagnosis terminal 473 of device 400.

At an initial time t0, input voltage V(IN) is at an high level, for example 6V, and transistor 401 is then non-conducting. The current flowing through transistor 401 is smaller than a threshold current IDS_TH and the voltage V(DS) flowing through transistor 401 is at a high level, for example 6V, and constant.

At a time t1, subsequent to time t0, voltage V(IN) transits to a low state, transistor 401 becomes conducting, voltage V(DS) falls under a threshold voltage VDS_TH. Gates of transistors 401, T2601, T2602, and T2603 receive a voltage inferior to the threshold voltage of these transistors. The gate of transistor T2604 receives still a high level voltage, and transistor T2604 force voltage V(DIAG_OC) to stay at a high level.

Between time t1 and a time t2, subsequent to time t1, current I(DS) increases, for example as a result of a short-circuit in device 400. At time t2, current I(DS) exceeds threshold current IDS_TH. Comparator C2601 detects it and voltage V(DIAG_OC) transits to a low state.

Between time t2 and a time t3, subsequent to time t2, voltage V(DIAG_OC) remains in the low state, and circuit 2600 forces transistor 401 to be non-conducting. Voltage V(DS) then transits to a high state, and current I(DS) decreases to return to its initial state. Voltage V(DIAG_OC) then alerts the circuits of device 400 while remaining in the low state at time t2.

After time t3, voltage V(DIAG_OC) transits back to a high state, and the alert is over.

FIG. 29 is a top view of the same practical example of embodiment of the device 400 described in relation with FIGS. 6 and 20, where the positioning of transistor T2602 is shown according to an embodiment.

Transistor T2602 is placed between two of the assemblies forming transistor 401. By being located in this way, transistor T2602 is adapted to receiving the same current as power transistor 401.

An advantage of this embodiment is that it allows to provide a protection against overcurrent having a time of response quick enough to avoid damage in the power transistor 401 in case of an overcurrent.

Figure 32:
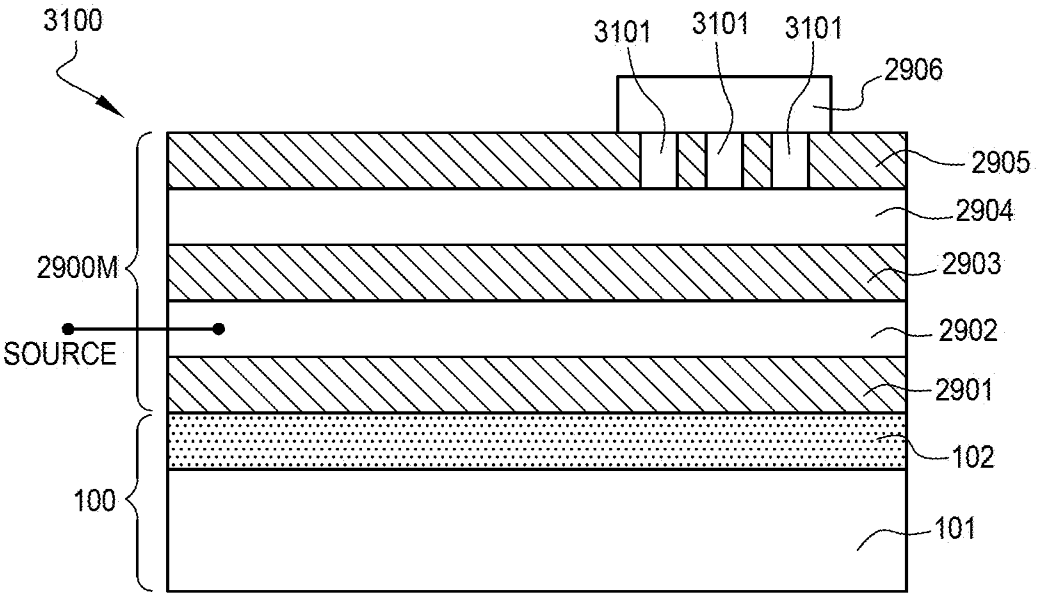
FIG. 32 schematically shows a cross-section view of a third embodiment of a connection terminal of the device of FIG. 4.

FIGS. 30 to 32 very schematically shows embodiments of connection terminals that may be one of the connection terminals 470 to 478 of the device 400 described in relation with FIG. 4.

FIG. 30 describes a structure 2900 comprising a first embodiment of a connection terminal that may form part of device 400.

Structure 2900 comprises the structure 100 described in relation with FIG. 1 and comprises a substrate 101 covered with a gallium nitride layer 102.

Structure 2900 further comprises, on structure 100, a stack 2900M forming metallization levels, in particular three metallization levels in FIG. 30. More particularly, stack 2900 comprises:

- an electrically-insulating layer 2901 resting on top of and in contact with the layer 102 of structure 100;
- an electrically-conductive layer 2902, for example, a metal layer, resting on top of and in contact with layer 2901;
- an electrically-insulating layer 2903 resting on top of and in contact with layer 2902; an electrically-conductive layer 2904, for example, a metal layer, resting on top of and in contact with layer 2903;
- an electrically-insulating layer 2905 resting on top of and in contact with layer 2904; and
- an electrically-conductive layer 2906, for example, a metal layer, resting on top of and in contact with layer 2905.

Layer 2906 is used to form a connection terminal, and is coupled to a node I/O. The connection terminal may be coupled to other connection terminals, for example, by a wireless solder method.

According to an embodiment, conductive layer 2902 is coupled, preferably connected, to the source terminal of power transistor 401.

The connection terminal formed by layer 2906 is electrically protected from structure 100, and components which are likely to be formed therein, by the parasitic capacitive elements formed by insulating layers 2901, 2903, and 2905.

FIG. 31 describes a structure 3000 comprising a second embodiment of a connection terminal that may form part of device 400.

Structure 3000 comprises elements common with the structure 2900 described in relation with FIG. 2900. These common elements will not be described again, and only the differences between structures 2900 and 3000 will be highlighted.

Conversely to structure 2900, structure 3000 only comprises two metallization levels, and thus, does not comprise layers 2905 and 2906. The connection terminal is formed in layer 2904.

The connection terminal formed by layer 2904 is electrically protected from structure 100, and from the components which are likely to be formed therein, by the parasitic capacitive elements formed by insulating layers 2901 and 2903.

FIG. 32 describes a structure 3100 comprising a third embodiment of a connection terminal that may form part of device 400.

Structure 3100 comprises elements common with the structure 2900 described in relation with FIG. 2900 and with the structure 3000 described in relation with FIG. 30. These common elements will not be described again and only the differences between structures 2900 and 300 will be highlighted.

Like structure 2900, structure 3100 comprises three metallization levels, but further comprises electrically-conductive vias 3101 coupling layer 2906 to layer 2905. The connection terminal is still formed in layer 2906.

The connection terminal formed by layer 2906 is electrically protected from structure 100, and from the components which are likely to be formed therein, by the parasitic capacitive elements formed by insulating layers 2901 and 2903.

FIGS. 33(A) to 36 show embodiments of applications of the device 400 described in relation with FIGS. 4 to 31.

Figure 33A:
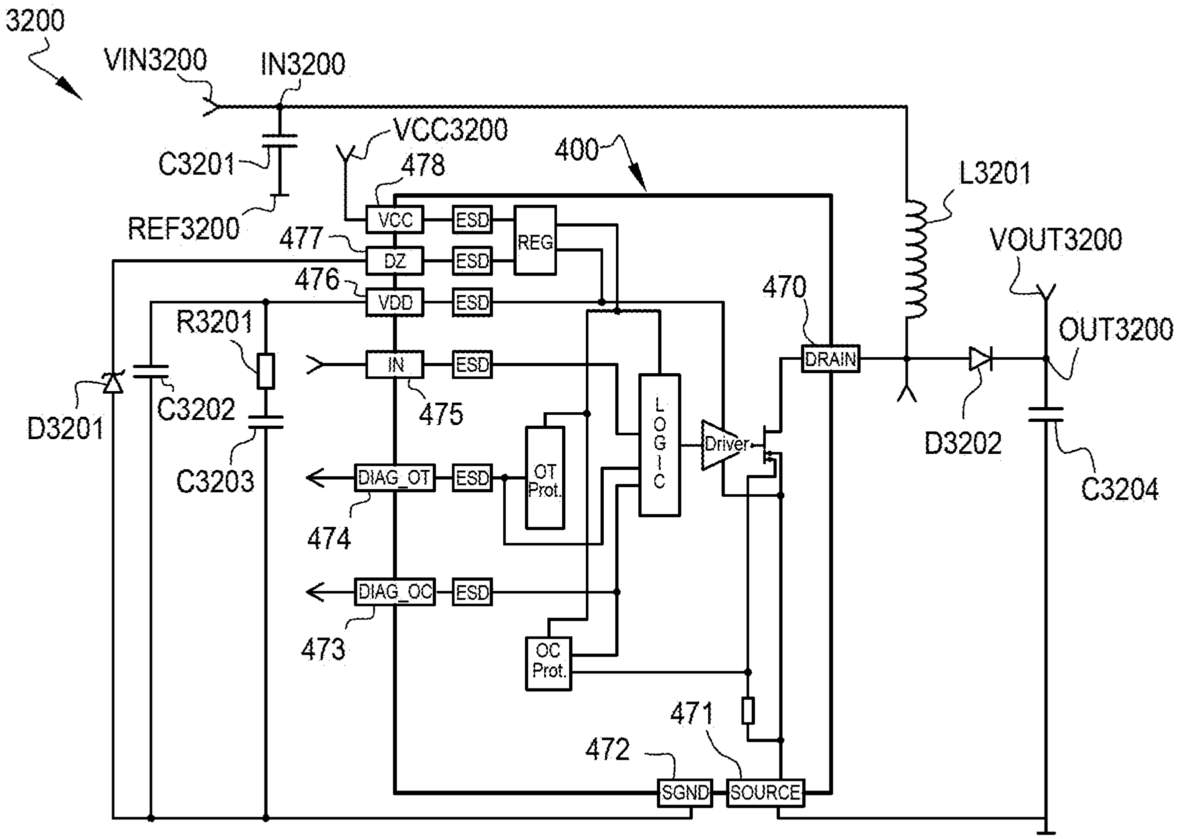
FIGS. 33(A) and 33(B), partially and schematically showing in the form of blocks an electric diagram of a first embodiment of an application of the embodiment of FIG. 4, and timing diagrams illustrating the execution of this first embodiment.
Figure 33B:
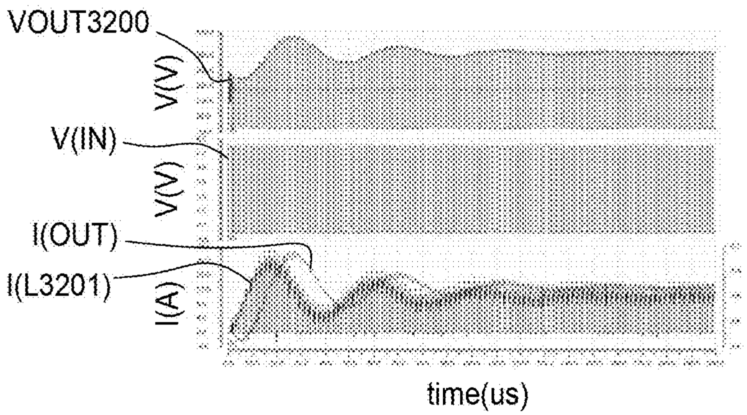

FIGS. 33(A) and 33(B) schematically and partially shows in the form of blocks a first embodiment of an application of device 400. More particularly, FIG. 32(A) illustrates an electronic device of the first embodiment, and FIG. 33(B) comprises timing diagrams illustrating how the first embodiment operates. In FIG. 33(A), device 400 is shown in the form of blocks in the same way as in FIG. 4. All the variants of the circuits of device 400 described in relation with FIGS. 5 to 31 are applicable herein.

In FIG. 33(A), device 400 is used in an electronic system 3200 to form a boost converter, that is, a switched-mode power supply adapted to converting a DC input voltage VIN3200 into a DC output voltage VOUT3200 of higher value. According to an example, voltage VIN3200 is in the order of 220 V or of 311 V. According to an example, voltage VOUT3200 is in the order of 400 V.

System 3200 comprises device 400. The input terminal 475 (IN) of device 400 receiving a command voltage from, for example, a processor external to system 3200. Terminal 478 (VCC) receives a supply potential VCC3200. Diagnosis terminals 474 (DIAG_OT) and 473 (DIAG_OC) are used as diagnosis terminals of system 200.

System 3200 further comprises an input terminal C3201 arranged between input terminal IN2300, receiving input voltage VIN3200 and a reference node REF3200. Thus, a first terminal of capacitor C3201 is coupled, preferably connected, to node IN3200 and a second terminal of capacitor C3201 is coupled, preferably connected, to reference node REF3200. Capacitor C3201 is a filtering capacitor.

System 3200 further comprises, between input node IN2300 and drain terminal 470 (DRAIN) of device 400, an output coil L3201. A first terminal of coil L3201 is coupled, preferably connected, to node IN3200 and a second terminal of coil 3201 is coupled, preferably connected, to the terminal 470 of device 400. The coil L3201 is used as a converter from DC voltage to DC voltage. Specifically, the coil L3201 stores energy and allows an additional power rail to be created.

System 3200 further comprises, between terminal 477 (DZ) and the reference terminal 472 of device 400, a zener diode D3201. The cathode of zener diode 3201 is coupled, preferably connected, to terminal 477 and the anode of zener diode D3201 is coupled, preferably connected, to terminal 472. Diode D3201 may represent the external diode used in the voltage and voltage or high voltage regulator circuits of device 400.

System 3200 further comprises, between terminal 476 (VDD) and the reference terminal 472 of device 400, a filtering capacitor C3202. A first terminal of capacitor C3202 is coupled, preferably connected, to terminal 476 and a second terminal of capacitor C3202 is coupled, preferably connected, to terminal 472.

System 3200 further comprises, as an option, between terminal 476 (VDD) and the reference terminal 472 of device 400, a resistor R3201 and a capacitor C3203. A first terminal of resistor R3201 is coupled, preferably connected, to terminal 476 and a second terminal of resistor R3201 is coupled, preferably connected, to a first terminal of capacitor C3203. A second terminal of capacitor C3203 is coupled, preferably connected, to terminal 472.

System 3200 further comprises, between the drain terminal 470 and the terminal 471 of device 400, a Schottky diode D3202 and an output capacitor C3204. The anode of diode D3202 is coupled, preferably connected, to drain terminal 470, and the cathode of diode D3202 is coupled, preferably connected, to the output node OUT3200 of system 3200, delivering output voltage VOUT3200, and to a first terminal of capacitor C3206. The second terminal of capacitor C3206 is coupled, preferably connected, to terminal 471.

How system 3200 operates is described in relation to FIG. 33(B). FIG. 33(B) includes the following timing diagrams:

- the timing diagram of the output voltage VOUT3200;
- the timing diagram of the control voltage V(IN) received by terminal 475;
- the timing diagram of the output current I(OUT); and
- the timing diagram of current I(L3201) flowing through coil L3201.

The command voltage V(IN) is a square wave voltage oscillating between a high level and a low level. The output voltage VOUT3200 is also a square wave voltage whose maximum voltage stabilizes little by little. In particular, when the 3200 system starts up, not all voltage regulator circuits are directly operational. The output voltage VOUT3200 and the output current I(OUT) therefore have a pseudoperiodic pattern for the time that all the voltage regulator circuits start, then each stabilize in a square wave signal alternating between a high state and a low state.

Figure 34:
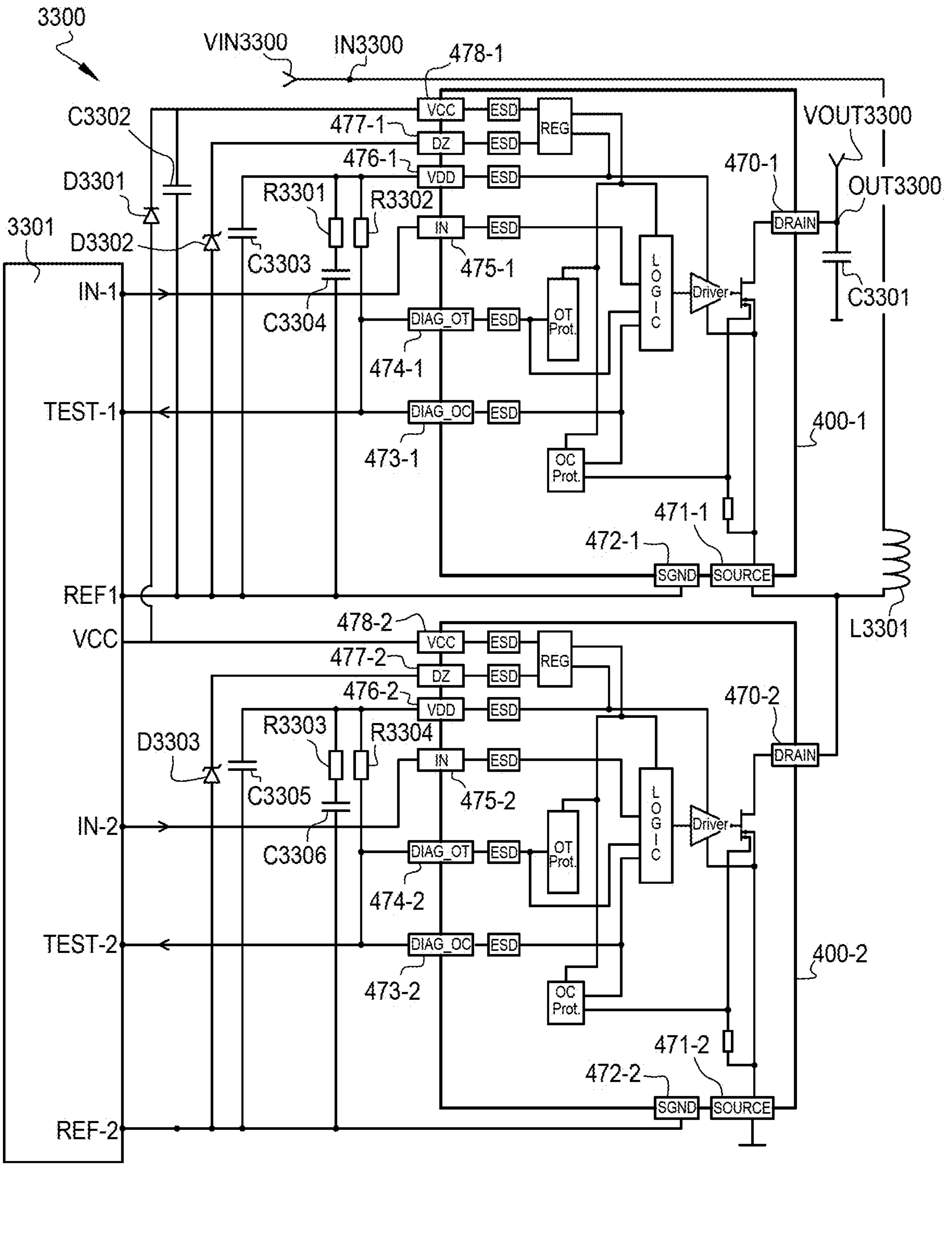
FIG. 34 partially and schematically shows in the form of blocks an electric diagram of a second embodiment of an application of the embodiment of FIG. 4.

FIG. 34 partially and schematically shows in the form of blocks a second embodiment of an application of device 400. In FIG. 34, device 400 is shown in the form of blocks in the same way as in FIG. 4. All the variants of the circuits of device 400 described in relation with FIGS. 5 to 31 are applicable herein.

In FIG. 34, device 400 is used in an electronic system 3300 to form an asymmetrical converter circuit, or push-pull converter in a half bridge configuration, that is, a circuit adapted to converting a DC input voltage VIN3300 into a DC output voltage VOUT3300. According to an example, voltage VIN3200 is in the order of 220 V or of 311 V. According to an example, voltage VOUT3200 is in the order of 400 V.

System 3300 comprises two devices 400, referenced in FIG. 34 as devices 400-1 and 400-2. The elements relative to device 400-1 have suffix "-1" at the end of the reference, and the elements relative to device 400-2 have suffix "-2" at the end of the reference.

System 3300 further comprises a system 3301 adapted to implementing devices 400-1 and 400-2. Control circuit 3301 comprises the following terminals:

- an input terminal IN-1 coupled, preferably connected, to the input terminal 475-1 (IN) of device 400-1;
- a diagnosis terminal TEST-1 coupled, preferably connected, to the diagnosis terminals 474-1 (DIAG_OT) and 473_1 (DIAG_OC) of device 400-1;
- a first reference terminal REF-1 coupled, preferably connected, to the terminal 472-1 (SGND) of device 400-1;
- a power supply terminal VCC coupled, preferably connected, to the terminal 478-2 of device 400-2;
- an input terminal IN2 coupled, preferably connected, to the input terminal 475-2 (IN) of device 400-2;
- a diagnosis terminal TEST-2 coupled, preferably connected, to the diagnosis terminals 474-2 (DIAG_OT) and 473-2 (DIAG_OC) of device 400-2; and
- a first reference terminal REF_2 coupled, preferably connected, to the terminal 472-2 (SGND) of device 400-2.

System 3300 further comprises, between input node IN3300, receiving input voltage VIN3300, and the node 471-1 of device 400-1, and the node 470-2 of device 400-2, a coil L3301. A first terminal of coil L3301 is coupled, preferably connected, to node IN3300 and a second terminal of coil L3301 is coupled, preferably connected, to terminal 471-1 and 470-2. The coil L3301 is used as a converter from DC voltage to DC voltage. Specifically, the coil L3301 stores energy and allows an additional power rail to be created.

System 3300 further comprises, between output node OUT3300, delivering output voltage VOUT3300, and the node 470-1 of device 400-1, a capacitor C3301. A first terminal of capacitor C3301 is coupled, preferably connected, to node OUT3300, and a second terminal of capacitor C3301 is coupled, preferably connected, to a reference terminal.

System 3300 further comprises, between the terminal 478-1 of device 400-1, the power supply terminal VCC of the control circuit, and the terminal 478-2 of device 400-2, a diode D3301. The cathode of diode D3301 is coupled, preferably connected, to terminal 478-1, and the anode of diode D3301 is coupled, preferably connected, to terminal VCC and to terminal 478-2.

The system further comprises, between the terminal 478-1 of device 400-1 and the power supply terminal VCC of control circuit 301, a capacitor C3302. A first terminal of capacitor C3302 is coupled, preferably connected, to terminal 478-1 and a second terminal of capacitor C3302 is coupled, preferably connected, to terminal VCC. Capacitor C3302 is used to shift a voltage of levels (bootstrap capacitor). Specifically, capacitor C3302 changes the voltage at the VCC terminal from a voltage referenced to the voltage at terminal 472-1 to a voltage referenced to an output reference voltage.

System 3300 further comprises, between the terminal 477-1 of device 400-1 and the terminal REF-1 of device 400-1, a Zener diode D3302. The cathode of diode D3302 is coupled, preferably connected, to terminal 477-1 and the anode of diode D3302 is coupled, preferably connected, to terminal REF-1.

System 3300 further comprises, between the terminal 476-1 of device 400-1 and the terminal REF-1 of device 400-1, a capacitor C3303. A first terminal of capacitor 3303 is coupled, preferably connected, to terminal 476-1 and a second terminal of capacitor C3303 is coupled, preferably connected, to terminal REF-1. Capacitor C3303 is used to supply the driver circuit of device 400-1.

System 3300 further comprises, as an option, between the terminal 476-1 of device 400-1, and the terminal REF-1 of device 400-1, a resistor R3301 and a capacitor C3304. A first terminal of resistor R3301 is coupled, preferably connected, to terminal 476-1 and a second terminal of resistor R3301 is coupled, preferably connected, to a first terminal of capacitor C3304. A second terminal of capacitor C3304 is coupled, preferably connected, to terminal REF-1.

The system further comprises, between the terminal 476-1 of device 400-1 and the terminals 474-1 and 473-1 of device 400-1, a resistor R3302. A first terminal of resistor R3302 is coupled, preferably connected, to terminal 476-1 and a second terminal of resistor R3302 is coupled, preferably connected, to terminals 474-1 and 473-1. Resistor R3302 is a pull-up resistor used to create a NOT-OR type logic function taking the output voltages of terminals 474-1 and 473-1 as input.

System 3300 further comprises, between the terminal 477-2 of device 400-2 and the terminal REF-2 of device 400-2, a zener diode D3303. The cathode of diode 3303 is coupled, preferably connected, to terminal 477-2 and the anode of diode D3303 is coupled, preferably connected, to terminal REF-2.

System 3300 further comprises, between the terminal 476-2 of device 400-2 and the terminal REF-2 of device 400-2, a capacitor C3305. A first terminal of capacitor C3305 is coupled, preferably connected, to terminal 476-2 and a second terminal of capacitor C3305 is coupled, preferably connected, to terminal REF-2. Capacitor C3305 is used to bias the output voltage of the driver circuit of device 400-2.

System 3300 further comprises, as an option, between the terminal 476-2 of device 400-2, and the terminal REF-2 of device 400-2, a resistor R3303 and a capacitor C3306. A first terminal of resistor R3303 is coupled, preferably connected, to terminal 476-2 and a second terminal of resistor R3303 is coupled, preferably connected, to a first terminal of capacitor C3306. A second terminal of capacitor C3306 is coupled, preferably connected, to terminal REF-2.

The system further comprises, between the terminal 476-2 of device 400-2 and the terminals 474-2 and 473-2 of device 400-2, a resistor R3304. A first terminal of resistor R3304 is coupled, preferably connected, to terminal 476-2 and a second terminal of resistor R3304 is coupled, preferably connected, to terminals 474-2 and 473-2. Resistor R3304 is a pull-up resistor used to create a NOT-OR type logic function taking the output voltages of terminals 474-2 and 473-2 as input.

Figure 35:
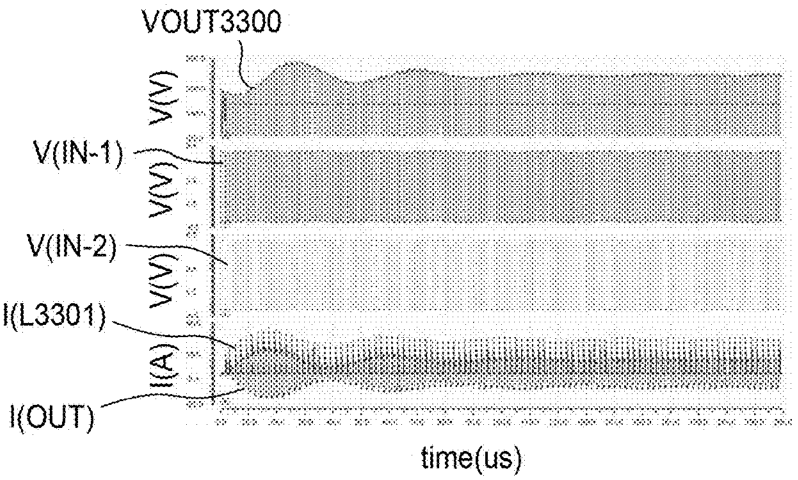
FIG. 35 shows timing diagrams illustrating the execution of the embodiment of FIG. 34.

The operation of the 3300 system is described in relation to FIG. 35.

FIG. 35 illustrates voltage and current timing diagrams of the system 3300 described in connection with FIG. 34. FIG. 35 includes the following timing diagrams:

- the timing diagram of the output voltage VOUT3300;
- the timing diagram of the control voltage V(IN-1) received by terminal 475-1;
- the timing diagram of the control voltage V(IN-2) received by terminal 475-2;
- the timing diagram of the output current I(OUT); and
- the timing diagram of current I(L3301) flowing through diode L3201.

The control voltages V(IN-1) and V(IN-2) are pulse voltages oscillating between a high state and a low state. The output voltage VOUT3300 is also a square wave voltage whose maximum voltage stabilizes little by little. Specifically, upon system 3300 startup, not all voltage regulator circuitry is directly operational. The output voltage VOUT3300 and the output current I(OUT) therefore have a pseudoperiodic pattern for the time that all the voltage regulator circuits start, then each stabilize in a square wave signal alternating between a high state and a low state.

FIG. 36 schematically and partially shows in the form of blocks a third embodiment of an application of device 400. In FIG. 36, device 400 is shown in the form of blocks in the same way as in FIG. 4. All the variants of the circuits of device 400 described in relation with FIGS. 5 to 31 are applicable herein.

In FIG. 36, device 400 is used in an electronic system to form a level shifter adapted to converting a DC input voltage VIN3200 into a DC output voltage VOUT3400. According to an example, voltage VIN3400 is in the order of 220 V or of 311 V. According to an example, voltage VOUT3200 is in the order of 400 V.

System 3400 comprises device 400. Device 400 comprises, in this embodiment, an additional power supply terminal 3401 (SUPPLY). Terminal 3401 is coupled, preferably connected, to a node IN3400 receiving input voltage VIN3400.

System 3400 further comprises an input capacitor C3401 arranged between input node IN3200 and a reference node REF3400. Thus, a first terminal of capacitor C3201 is coupled, preferably connected, to node IN3200 and a second terminal of capacitor C3401 is coupled, preferably connected, to reference node REF3400.

System 3400 further comprises, between input node IN2300 and drain terminal 470 (DRAIN) of device 400, an output coil L3401. A first terminal of coil L3401 is coupled, preferably connected, to node IN3400 and a second terminal of coil 3401 is coupled, preferably connected, to the terminal 470 of device 400. Coil L3401 forms a first winding of a transformer delivering the output voltage VOUT3400 of system 3400.

System 3400 further comprises a second portion of the transformer having coil L3401 forming part thereof. This portion comprises a coil L3402, forming a second winding of the transformer, a diode D3401, and a capacitor C3402. A first terminal of coil L3402 is coupled, preferably connected, to the anode of diode D3401 and the cathode of diode D3401 is coupled, preferably connected, to a node OUT3400 delivering output voltage VOUT3400. A second terminal of coil L3402 is coupled, preferably connected, to a first terminal of capacitor C3402 and a second terminal of capacitor C3402 is coupled, preferably connected, to node C3402.

System 3400 further comprises a third portion of the transformer having coils L3401 and L3402 forming part thereof. This portion comprises a coil L3403, forming a third winding of the transformer, a diode D3402, and a capacitor C3403. A first terminal of coil L3403 is coupled, preferably connected, to the anode of diode D3402 and the cathode of diode D3402 is coupled, preferably connected, to the terminal 478 of device 400. A second terminal of coil L3403 is coupled, preferably connected, to a first terminal of capacitor C3403, and a second terminal of capacitor C4303 is coupled, preferably connected, to terminal 478.

System 3400 further comprises, between terminal 477 (DZ) and the reference terminal 472 of device 400, a zener diode D3403. The cathode of zener diode 3403 is coupled, preferably connected, to terminal 477 and the anode of zener diode D3403 is coupled, preferably connected, to terminal 472. Diode D3403 may represent the external diode used in the voltage and voltage or high voltage regulator circuits of device 400.

System 3400 further comprises, between terminal 476 (VDD) and the reference terminal 472 of device 400, a filtering capacitor C3404. A first terminal of capacitor C3404 is coupled, preferably connected, to terminal 476 and a second terminal of capacitor C3404 is coupled, preferably connected, to terminal 472.

System 3400 further comprises, as an option between terminal 476 (VDD) and the reference terminal 472 of device 400, a resistor R3401 and a capacitor C3405. A first terminal of resistor R3401 is coupled, preferably connected, to terminal 476 and a second terminal of resistor R3401 is coupled, preferably connected, to a first terminal of capacitor C3405. A second terminal of capacitor C3405 is coupled, preferably connected, to terminal 472.

System 3400 operates as follows. When system 3400 starts, only terminal 3401 supplies power to the system, but once the voltage regulators are started, terminals 3401 and 478 supply power to the system, and the VOUT3400 output voltage stabilizes in the same way as for the systems 3200 and 3400.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove.

Voltage regulation circuit (700; 800; 900; 1000; 1100; 1200; 1300; 1400) formed inside and on top of a monolithic semiconductor substrate (101) having a surface covered with a gallium nitride layer (102), may be summarized as including between a first terminal (VCC) and a second terminal (DZ), a first resistor (R701) and a first d-mode type HEMT transistor; and between the first terminal (VCC) and the third terminal (VDD), a second d-mode type HEMT transistor; wherein the midpoint between the first resistor (R701) and the first transistor (T701) is coupled to the gates of the first and second transistors (T701, T702).

Circuit may further include, between the second terminal (DZ) and a reference terminal, a zener diode (D701).

The zener diode (D701) may be formed on a portion of the semiconductor substrate which is not covered with the gallium nitride layer.

The second terminal (DZ) or the third terminal (VDD) may be adapted to delivering a power supply voltage.

Circuit may further include, between the first resistor (R701) and the first transistor (T701), a third d-mode type HEMT transistor (T801) having its gate coupled to the middle node between the first resistor (R701) and the third transistor (T801).

Circuit may further include, between the first terminal (VCC) and a first node (OUT800) adapted to delivering a power supply voltage, a fifth d-mode type HEMT transistor (T802) having its gate coupled to the gate of the third transistor (T801).

Circuit may further include, between the first terminal (VCC) and a second node (OUT901) adapted to delivering a power supply voltage, a sixth d-mode type HEMT transistor (T901) having its gate coupled to the gate of the first transistor (T701).

Circuit may further include, between the first terminal (VCC) and the second terminal (DZ) a seventh HEMT transistor (T1101; T1201) and a second resistor (R1101), the drain of the seventh transistor (T1101; T1201) being coupled to the first terminal (VCC), the source of the seventh transistor (T1101; T1201) being coupled to a first terminal of said second resistor, and a second terminal of said second resistor being coupled to the second terminal (DZ).

The seventh transistor (1101) may be of d-mode type and may have its gate coupled to its drain.

The seventh transistor (T1101) may be of e-mode type and may be adapted to receiving on its gate a bias voltage (VBIAS).

High voltage regulation circuit (1500; 1600) may be summarized as including the voltage regulator circuit.

Circuit may further include the voltage regulator circuit.

Circuit may include: between a fourth terminal and said first terminal (VCC), a first diode (D1501) having its anode coupled to the fourth terminal and its cathode coupled to the first terminal (VCC); between a fifth terminal (SUPPLY) and the first terminal, an eight d-mode type HEMT transistor (T1501) and a second diode (D1502); between a fifth terminal (SUPPLY) and a sixth terminal (SGND), a third resistor (R1501) and a flip-flop (C1501); and the gate of the eighth transistor (1510) being coupled to the midpoint between said third resistor (R1501) and said flip-flop (C1501).

Said eighth transistor (T1501) may be adapted to being controlled by a control circuit including: a ninth e-mode type HEMT transistor (T1601) having its drain coupled to the gate of the eighth transistor (T1501) and its source coupled to the sixth terminal (SGND); a comparator circuit (C1601) adapted to delivering a control voltage to the gate of said ninth transistor (T1610) and adapted to comparing the voltage of the first terminal (VCC) with a reference voltage (VREF1600); a circuit (G1610) adapted to delivering said reference voltage (VREF1600).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A voltage regulation circuit, comprising:
- a monolithic semiconductor substrate having a surface covered with a gallium nitride layer;
- a first terminal;
- a second terminal;
- a third terminal;
- a reference terminal a first resistor between the first terminal and the second terminal;
- a first d-mode type HEMT transistor between the first terminal and the second terminal;
- a Zener diode coupled between the second terminal and the reference terminal, wherein the Zener diode is formed on a portion of the semiconductor substrate which is not covered with the gallium nitride layer; and
- a second d-mode type HEMT transistor between the first terminal and the third terminal, wherein a gate terminal of the first transistor and a gate terminal of the second transistor are coupled between the first resistor and the first transistor.

2. The circuit according to claim 1, wherein the second terminal or the third terminal are adapted to delivering a power supply voltage.

3. The circuit according to claim 1, further comprising, between the first resistor and the first transistor, a third d-mode type HEMT transistor having its gate coupled to a middle node between the first resistor and the third transistor.

4. The circuit according to claim 3, further comprising, between the first terminal and a first node adapted to delivering a power supply voltage, a fourth d-mode type HEMT transistor having a gate coupled to the gate of the third transistor.

5. The circuit according to claim 4, further comprising, between the first terminal and a second node adapted to delivering a power supply voltage, a fifth d-mode type HEMT transistor having a gate coupled to the gate of the first transistor.

6. The circuit according to claim 5, further comprising, between the first terminal and the second terminal a sixth HEMT transistor and a second resistor, the drain of the sixth transistor being coupled to the first terminal, the source of the sixth transistor being coupled to a first terminal of said second resistor, and a second terminal of said second resistor being coupled to the second terminal.

7. The circuit according to claim 6, wherein the sixth transistor is of d-mode type and has a gate coupled to a drain.

8. The circuit according to claim 6, wherein the sixth transistor is of e-mode type and is adapted to receiving on a gate a bias voltage.

9. A high voltage regulation circuit, comprising:

a monolithic semiconductor substrate;

a gallium nitride layer on the substrate;

a voltage regulator circuit that includes:

a first terminal;

a second terminal;

a third terminal;

a first resistor between the first terminal and the second terminal;

a first d-mode type HEMT transistor between the first terminal and the second terminal; and a second d-mode type HEMT transistor between the first terminal and the third terminal, a midpoint between the first resistor and the first transistor is coupled to gates of the first and second transistors;

between the first resistor and the first transistor, a third d-mode type HEMT transistor having its gate coupled to a middle node between the first resistor and the third transistor; and between the first terminal and a first node adapted to delivering a power supply voltage, a fourth d-mode type HEMT transistor having a gate coupled to the gate of the third transistor.

10. The circuit according to claim 9, comprising, between the first terminal and a second node adapted to delivering a power supply voltage, a fifth d-mode type HEMT transistor having a gate coupled to the gate of the first transistor.

11. The circuit according to claim 10, comprising, between the first terminal and the second terminal a seventh HEMT transistor and a second resistor, the drain of the sixth transistor being coupled to the first terminal, the source of the sixth transistor being coupled to a first terminal of said second resistor, and a second terminal of said second resistor being coupled to the second terminal.

12. The circuit according to claim 11, comprising:

between a fourth terminal and said first terminal, a first diode having its anode coupled to the fourth terminal and its cathode coupled to the first terminal;

between a fifth terminal and the first terminal, a seventh d-mode type HEMT transistor and a second diode;

between a fifth terminal and a sixth terminal, a third resistor and a flip-flop; and a gate of the eighth transistor being coupled to the midpoint between said third resistor and said flip-flop.

13. The circuit according to claim 12, wherein the seventh transistor is adapted to being controlled by a control circuit comprising:

an eighth e-mode type HEMT transistor having its drain coupled to the gate of the seventh transistor and its source coupled to the sixth terminal;

a comparator circuit adapted to delivering a control voltage to the gate of said eighth transistor and adapted to comparing the voltage of the first terminal with a reference voltage; and a circuit adapted to delivering said reference voltage.

14. A device, comprising:

a substrate;

a gallium nitride layer on the substrate;

a voltage regulator circuit that includes:

a first terminal;

a second terminal;

a third terminal;

a first d-mode type HEMT transistor between the first terminal and the second terminal, a first gate of the first transistor is coupled to a source/drain of the first transistor;

a second d-mode type HEMT transistor between the first terminal and the third terminal, a second gate of the second transistor being coupled to the first gate of the first transistor;

a first resistor between the first terminal and the second terminal;

between the first resistor and the first transistor, a third d-mode type HEMT transistor having its gate coupled to a middle node between the first resistor and the third transistor;

between the first terminal and a first node adapted to delivering a power supply voltage, a fourth d-mode type HEMT transistor having a gate coupled to the gate of the third transistor.

15. The device of claim 14, comprising:

a first capacitor coupled between the third terminal and ground.

16. The device of claim 14, further comprising, between the second terminal and a reference terminal, a Zener diode.

17. The device of claim 16, wherein the Zener diode is formed on a portion of the semiconductor substrate which is not covered with the gallium nitride layer.

18. The device of claim 14, further comprising, between the first terminal and a second node adapted to delivering a power supply voltage, a fifth d-mode type HEMT transistor having a gate coupled to the gate of the first transistor.

19. The device of claim 18, further comprising, between the first terminal and the second terminal a sixth HEMT transistor and a second resistor, the drain of the sixth transistor being coupled to the first terminal, the source of the sixth transistor being coupled to a first terminal of said second resistor, and a second terminal of said second resistor being coupled to the second terminal.

20. The device of claim 19, wherein the sixth transistor is of d-mode type and has a gate coupled to a drain.

* * * * *